US010692988B2

United States Patent
Liu et al.

(10) Patent No.: US 10,692,988 B2
(45) Date of Patent: Jun. 23, 2020

(54) SEMICONDUCTOR DEVICE HAVING INTEGRATED MOS-GATED OR SCHOTTKY DIODES

(71) Applicant: Infineon Technologies Austria AG, Villach (AT)

(72) Inventors: Jian Liu, Torrance, CA (US); Yan Gao, San Diego, CA (US)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 16/199,608

(22) Filed: Nov. 26, 2018

(65) Prior Publication Data

US 2020/0168719 A1    May 28, 2020

(51) Int. Cl.
| | |
|---|---|
| *H01L 29/66* | (2006.01) |
| *H01L 29/47* | (2006.01) |
| *H01L 29/10* | (2006.01) |
| *H01L 29/78* | (2006.01) |

(52) U.S. Cl.
CPC .... *H01L 29/66484* (2013.01); *H01L 29/1095* (2013.01); *H01L 29/47* (2013.01); *H01L 29/66727* (2013.01); *H01L 29/66734* (2013.01); *H01L 29/7806* (2013.01); *H01L 29/7811* (2013.01); *H01L 29/7813* (2013.01)

(58) Field of Classification Search
CPC ............... H01L 29/66734; H01L 29/47; H01L 29/7806; H01L 29/7813
See application file for complete search history.

(56) References Cited

U.S. PATENT DOCUMENTS

| | | | |
|---|---|---|---|
| 2003/0040144 A1 | 2/2003 | Blanchard et al. | |
| 2005/0199918 A1 | 9/2005 | Calafut et al. | |
| 2006/0060916 A1 | 3/2006 | Girdhar et al. | |
| 2010/0301410 A1 | 12/2010 | Hirler | |
| 2012/0098082 A1 | 4/2012 | Hsu et al. | |
| 2017/0194484 A1* | 7/2017 | Zundel | H01L 29/66727 |
| 2017/0309713 A1* | 10/2017 | Hirler | H01L 29/7806 |
| 2017/0330941 A1* | 11/2017 | Hutzler | H01L 29/41708 |
| 2018/0083111 A1 | 3/2018 | Hirler et al. | |

* cited by examiner

*Primary Examiner* — Mohammed Shamsuzzaman
*Assistant Examiner* — Khatib A Rahman
(74) *Attorney, Agent, or Firm* — Murphy, Bilak & Homiller, PLLC

(57) ABSTRACT

A semiconductor device includes a semiconductor substrate and a plurality of transistor cells. Each transistor cell includes: a gate trench structure formed in the semiconductor substrate and circumscribing the transistor cell; a needle-shaped field electrode trench structure formed in the semiconductor substrate and spaced inward from the gate trench structure; a source region of a first conductivity type formed in the semiconductor substrate adjacent the gate trench structure; a body region of a second conductivity type opposite the first conductivity type formed in the semiconductor substrate below the source region; and a drift zone of the first conductivity type formed in the semiconductor substrate below the body region. The semiconductor device further includes a plurality of MOS-gated diodes or Schottky diodes, each diode formed in the semiconductor substrate at an intersection of four adjacent transistor cells. Corresponding methods of manufacture are also described.

21 Claims, 20 Drawing Sheets

SEMICONDUCTOR DEVICE HAVING INTEGRATED MOS-GATED OR SCHOTTKY DIODES

BACKGROUND

In many applications, especially low voltage drive applications, MOSFETs (metal-oxide-semiconductor field-effect transistors) with low Rdson (on-state resistance), low gate charge and a built-in body diode are used to achieve high efficiency. A body diode having low forward voltage (Vf) and low reverse recovery (Qrr) aids in reducing the overall loss, and may be critical in certain applications. As such, low diode forward voltage drop is typically one of if not the highest priorities among all device electrical parameters.

Bipolar operation of a body diode with a typical forward voltage of 0.8 to ~1V is undesirable for reliable device operation and reduced conduction loss. A Schottky contact-based unipolar-type diode can be externally connected in parallel to a MOSFET as a separate chip (die) to accommodate current in the opposite direction. However, this approach increases package size and cost of implementation in power converters. This approach also introduces a high degree of parasitic inductance between separately-packaged devices, reducing efficiency and switching frequency. In the case of a diode integrated with a MOSFET, the parasitic inductance is reduced significantly. However, this approach conventionally utilizes the MOSFET conduction (active) area, therefore having a significant adverse impact on Rdson.

Thus, there is a need for a semiconductor device with low Rdson and having an integrated diode with low diode forward voltage and low reverse recovery.

SUMMARY

According to an embodiment of semiconductor device, the semiconductor device comprises a semiconductor substrate and a plurality of transistor cells. Each transistor cell comprises: a gate trench structure formed in the semiconductor substrate and circumscribing the transistor cell; a needle-shaped field electrode trench structure formed in the semiconductor substrate and spaced inward from the gate trench structure; a source region of a first conductivity type formed in the semiconductor substrate adjacent the gate trench structure; a body region of a second conductivity type opposite the first conductivity type formed in the semiconductor substrate below the source region; and a drift zone of the first conductivity type formed in the semiconductor substrate below the body region. The semiconductor device further comprises a plurality of MOS-gated diodes or Schottky diodes, each diode formed in the semiconductor substrate at an intersection of four adjacent transistor cells.

In a first embodiment, a MOS-gated diode is formed in the semiconductor substrate at the intersection of four adjacent transistor cells. Each MOS-gated diode may comprise: an electrode trench formed in the semiconductor substrate and laterally spaced apart from the gate trench structures of the four adjacent transistor cells; a first region of the second conductivity type formed in the semiconductor substrate adjacent the electrode trench; a first region of the first conductivity type formed in the first region of the second conductivity type; and a conductive material electrically connecting the first region of the first conductivity type and the first region of the second conductivity type to an electrode in the electrode trench. Separately or in combination, each MOS-gated diode may further comprise a second region of the first conductivity type formed in a recessed section of the first region of the second conductivity type, and the conductive material may contact the first region of the first conductivity type and the second region of the first conductivity type. Separately or in combination, each MOS-gated diode may further comprise a contact trench laterally surrounding the electrode trench and laterally spaced apart from the gate trench structures of the four adjacent transistor cells, and the contact trench may be filled with the conductive material. Separately or in combination, each MOS-gated diode may further comprise a second region of the second conductivity type formed in the first region of the second conductivity type, the second region of the second conductivity type may be doped more heavily than the first region of the second conductivity type, and the conductive material may contact the second region of the second conductivity type.

In a second embodiment, a Schottky diode is formed in the semiconductor substrate at the intersection of four adjacent transistor cells. Each Schottky diode may comprise a metal or metal alloy in contact with a region of the semiconductor substrate of the first conductivity type. Separately or in combination, each Schottky diode may comprise: an electrode trench formed in the semiconductor substrate and laterally spaced apart from the gate trench structures of the four adjacent transistor cells; and a metal electrically connecting an electrode in the electrode trench to a region of the semiconductor substrate of the second conductivity type adjacent the electrode trench. Separately or in combination, a section of the region of the semiconductor substrate of the second conductivity type adjacent each electrode trench may be recessed below a main surface of the semiconductor substrate. Separately or in combination, the metal of each Schottky diode may contact a region of the semiconductor substrate of the first conductivity type formed above the recessed section of the region of the semiconductor substrate of the second conductivity type.

According to an embodiment of a method of manufacturing a semiconductor device, the method comprises: forming a plurality of transistor cells in a semiconductor substrate, each transistor cell comprising: a gate trench structure formed in the semiconductor substrate and circumscribing the transistor cell; a needle-shaped field electrode trench structure formed in the semiconductor substrate and spaced inward from the gate trench structure; a source region of a first conductivity type formed in the semiconductor substrate adjacent the gate trench structure; a body region of a second conductivity type opposite the first conductivity type formed in the semiconductor substrate below the source region; and a drift zone of the first conductivity type formed in the semiconductor substrate below the body region; and forming a plurality of MOS-gated diodes or Schottky diodes in the semiconductor substrate, each diode formed in the semiconductor substrate at an intersection of four adjacent transistor cells.

Forming the plurality of MOS-gated diodes or Schottky diodes in the semiconductor substrate may comprise: etching electrode trenches of the plurality of MOS-gated diodes or Schottky diodes into the semiconductor substrate at a same time gate trenches of the plurality of transistor cells are etched into the semiconductor substrate, using a common trench etching process; forming a first dielectric on sidewalls and a bottom of the gate trenches and of the electrode trenches; after forming the first dielectric, forming an electrode in the electrode trenches to form electrode trench structures; forming a first region of the second conductivity type in the semiconductor substrate adjacent each electrode trench; forming a first region of the first conductivity type in each first region of the second conductivity type; and forming a conductive material which electrically connects the first region of the first conductivity type and the first region of the second conductivity type to the electrode in each electrode trench.

Separately or in combination, forming the gate trench structures may comprise: forming a second dielectric on the sidewalls and the bottom of the gate trenches, the second dielectric being thicker than the first dielectric; and after forming the second dielectric, forming an electrode in the gate trenches.

Separately or in combination, the first region of the second conductivity type may be formed in the semiconductor substrate adjacent each electrode trench at a same time the body region of the plurality of transistor cells is formed, using a common body implantation process.

Separately or in combination, forming the plurality of MOS-gated diodes or Schottky diodes in the semiconductor substrate may further comprise: forming a second region of the second conductivity type in each first region of the second conductivity type, wherein the second region of the second conductivity type is doped more heavily than the first region of the second conductivity type, wherein the conductive material contacts the second region of the second conductivity type.

Separately or in combination, forming the plurality of MOS-gated diodes or Schottky diodes in the semiconductor substrate may further comprise recessing the electrode trench structures and a section of the first region of the second conductivity type to reduce the thickness of the first region of the second conductivity type along the sidewalls of the electrode trenches.

Separately or in combination, the first region of the first conductivity type may be formed in the recessed section of the first region of the second conductivity type.

Separately or in combination, forming the plurality of MOS-gated diodes or Schottky diodes in the semiconductor substrate may further comprise: etching a plurality of contact trenches into the semiconductor substrate, each contact trench laterally surrounding one of the electrode trenches and being laterally spaced apart from the gate trench structures of the four adjacent transistor cells; and filling the plurality of contact trenches with the conductive material.

Separately or in combination, forming the plurality of MOS-gated diodes or Schottky diodes in the semiconductor substrate may comprise: depositing an electrically conductive material in direct contact with the semiconductor substrate at the intersection of four adjacent transistor cells.

Separately or in combination, forming the plurality of MOS-gated diodes or Schottky diodes in the semiconductor substrate may comprise: etching a plurality of electrode trenches into the semiconductor substrate, each electrode trench being laterally spaced apart from the gate trench structures of the four adjacent transistor cells; and depositing a metal which electrically connects an electrode in each electrode trench to a region of the semiconductor substrate adjacent the electrode trench.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

The embodiments described monolithically integrate a power MOSFET with a MOS-gated diode (MGD) or Schottky diode in a single chip (die). A non-conducting area of the chip is used for the low forward voltage drop diode, and hence having no adverse effect on transistor gate length or Rdson. The integrated MGD or Schottky diode reduces the forward voltage (Vf) drop of the built-in body diode, e.g., by almost 50% or more and also has a lower reverse recovery charge (Qrr) as compared to conventional built-in body diodes. The integrated MGD or Schottky diode is formed in a non-conducting (non-active) area of the power MOSFET, and therefore has minimal impact on the current path of the semiconductor device. Compared to conventional solutions which use an additional discrete diode chip, the embodiments described herein provide an integrated solution with reduced parasitic inductance and increased switching frequency in circuit. Contacts to the MGD or Schottky diodes may be opened at the same time as contacts to the transistor cells. Any desired ratio of MGD/Schottky to active area may be realized.

In some embodiments, both the MOSFET and the integrated diode share not only a forward conducting layer of the device, but they also share an edge termination region such that significant die/wafer area can be saved. In addition, the embodiments described herein reduce the number of packages and cost of implementing the semiconductor device in power converter applications, and also improves efficiency and increases switching frequency by eliminating parasitic inductance between separately packaged MOSFET and diode devices.

Figure 1:
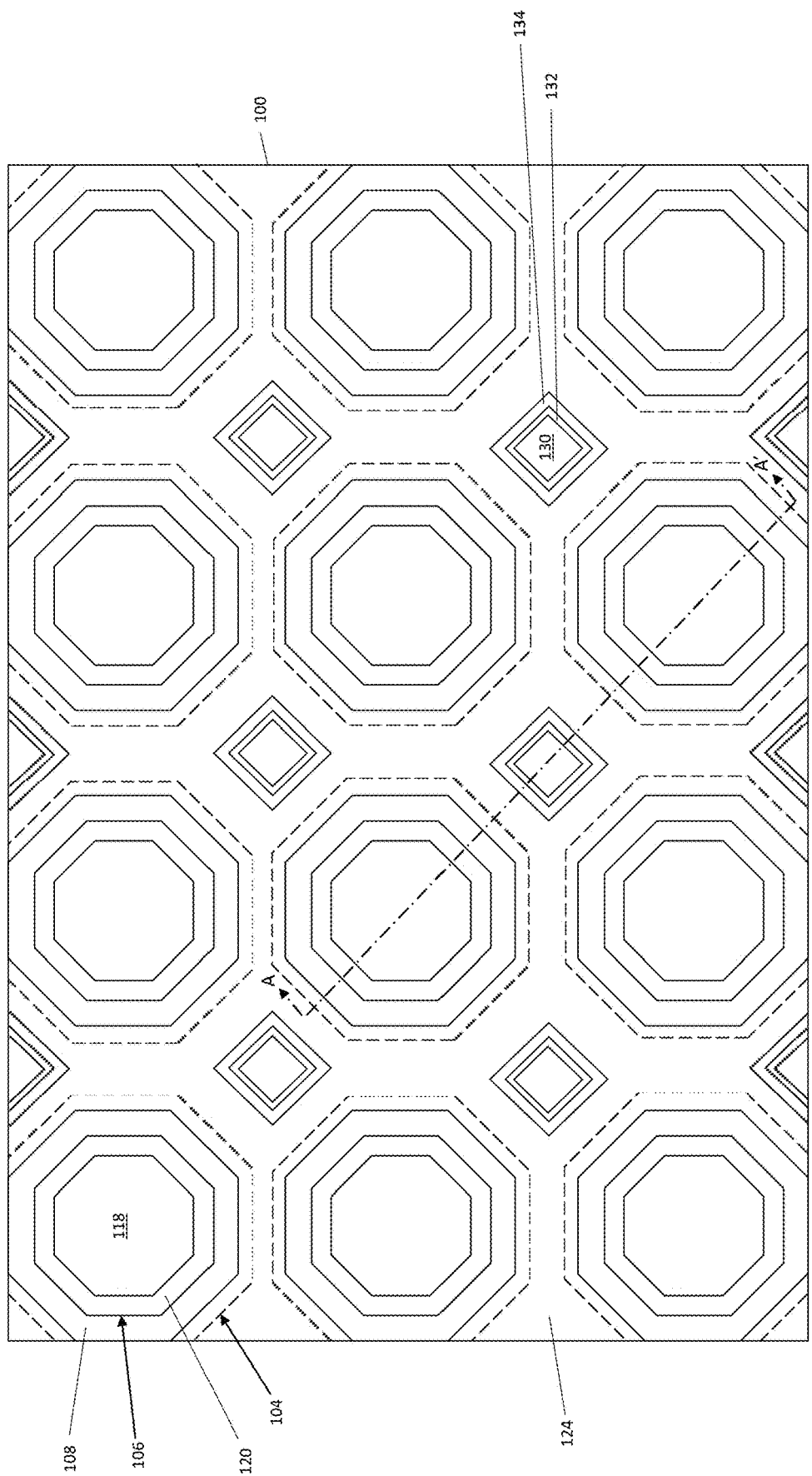
FIG. 1 illustrates a top-down plan view of a section of a semiconductor device having a power transistor and a MOS-gated diode (MGD) or Schottky diode integrated in a single chip (die).

FIG. 1 illustrates a top-down plan view of a section of a semiconductor device having a power transistor and a MOS-gated diode (MGD) or Schottky diode integrated in a single chip (die). FIGS. 2 through 5 and FIGS. 7 through 10 illustrate respective cross-sectional views of the semiconductor device taken along the line labelled A-A' in FIG. 1, according to different embodiments.

The semiconductor device includes a semiconductor substrate 100 and a plurality of transistor cells 102 formed in the semiconductor substrate 100. The transistor cells 102 collectively yield a power transistor such as a power MOSFET. In one embodiment, the semiconductor substrate 100 is a silicon substrate which may include one or more Si epitaxial layers. In general, the semiconductor substrate 100 described herein can be made of any semiconductor material suitable for manufacturing a semiconductor device. Examples of such materials include, but not limited to, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), etc.

Each transistor cell 102 formed in the semiconductor substrate 100 includes: a gate trench structure 104 formed in the semiconductor substrate 100 and circumscribing the transistor cell 102; a needle-shaped field electrode trench structure 106 formed in the semiconductor substrate 100 and spaced inward from the gate trench structure 104; a source region 108 of a first conductivity type formed in the semiconductor substrate 100 adjacent the gate trench structure 104; a body region 110 of a second conductivity type opposite the first conductivity type formed in the semiconductor substrate 100 below the source region 108; and a drift zone 112 of the first conductivity type formed in the semiconductor substrate 100 below the body region 110. In the case of an n-channel transistor device, the source region 108 and drift zone 112 are n-type and the body region 110 is p-type. In the case of a p-channel transistor device, the source region 108 and drift zone 112 are p-type and the body region 110 is n-type. The drain or collector region of the semiconductor device is disposed at the bottom main surface of the semiconductor substrate 100 which is out of view in the figures.

The term "needle-shaped" as used herein means a structure that is narrow and long in a depth-wise direction of the semiconductor substrate 100. For example, the needle-shaped field electrode trench structures 106 may resemble a needle, column or spicule in a depth-wise direction of the semiconductor substrate 100. Each needle-shaped field electrode trench structure 106 is laterally surrounded by a gate trench structure 104. Hence, the gate trench structures 104 have a different shape than the field electrode trench structures 106.

The gate trench structures 104 of the semiconductor device may include a gate electrode 114 insulated from the surrounding semiconductor substrate 100 by a gate dielectric 116 such as a gate oxide. The needle-shaped field electrode trench structures 106 of the semiconductor device may include a needle-shaped field electrode 118 insulated from the surrounding semiconductor substrate 100 by a field dielectric 120 such as a field oxide. The field oxide 120 may be thicker than the gate dielectric 116. The needle-shaped field electrodes 118 may extend deeper into the semiconductor substrate 100 than the gate electrodes 114. The needle-shaped field electrodes 118 are shown with an octagonal shape in the horizontal cross-sectional plane of FIG. 1 which extends parallel to the top main surface 101 of the semiconductor substrate 100. The needle-shaped field electrodes 118 may have another shape in the horizontal cross-sectional plane, such as but not limited to, hexagonal, circular, square, rectangular, etc. The needle-shaped field electrode trench structures 106 may be recessed below the top main surface 101 of the semiconductor substrate 100 to facilitate contact between an overlying metal layer 120 and the needle-shaped field electrodes 118, the sides of the source regions 108, and highly doped (e.g. p+ regions in the case of an n-channel device or n+ regions in the case of a p-channel device) body contact regions 122 formed in the body regions 110. An interlayer dielectric 124 such as an oxide may separate the metal layer 120 from the gate trench structures 104 of the semiconductor device.

The gate crossing area of the semiconductor device, i.e. the intersection of four adjacent transistor cells 102, does not contribute to current flow of the power transistor formed by the transistor cells 102. The embodiments described herein utilize this area of the semiconductor device to integrate a plurality of MGDs 126 or Schottky diodes 126'. Each diode 126/126' is formed in the semiconductor substrate 100 at the intersection of four adjacent transistor cells 102. Certain regions of the interlayer dielectric 124 are omitted from FIG. 1 to better illustrate the transistors cells 102 and MGDs 126 in the top-down plan view of the device. The gate trench structures 104 are illustrated with dashed octagons in FIG. 1 since the gate trench structures 104 are covered by the interlayer dielectric 124 in FIG. 1.

According to the embodiments illustrated in FIGS. 2 through 5, an MGD 126 is formed in the semiconductor substrate 100 at the intersection of four adjacent transistor cells 102. Each MGD 126 includes an electrode trench 128 formed in the semiconductor substrate 100 and laterally spaced apart from the gate trench structures 104 of the four adjacent transistor cells 102. The MGD electrode trenches 128 may include an electrode 130 insulated from the surrounding semiconductor substrate 100 by a dielectric 132 which may be the same or different dielectric as the gate dielectric 116 in the transistor cells 102. The MGD trench dielectric 132 may be thinner than the gate trench dielectric 116 in the transistor cells 102, for example, by a factor of about 10× or more. In one embodiment, the MGD dielectric 132 is about 6 to 7 nm (nanometers) thick and the gate dielectric 116 in the transistors cells 102 is about 60 nm or more thick.

A region 134 of the second conductivity type is formed in the semiconductor substrate 100 adjacent the electrode trench 128 of each MGD 126. This region 134 is akin to the body region 110 in the transistor cells 102, but is not part of the current path of the semiconductor device. The doping concentration of region 134 of the second conductivity type of the MGDs 126 may be tailored differently than the doping concentration of the body region 110 of the transistor cells 102.

Figure 2:
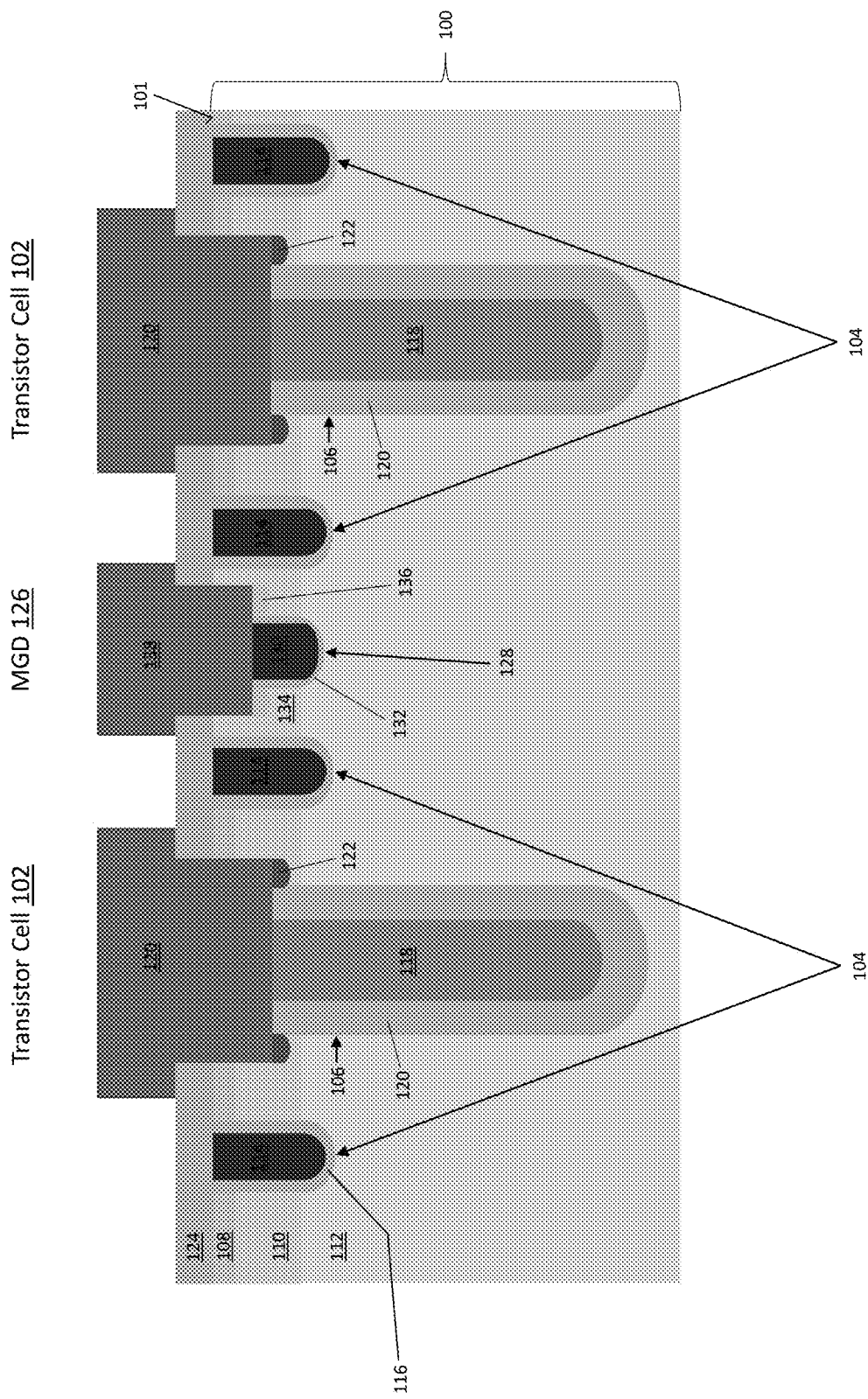
FIGS. 2 through 5 and FIGS. 7 through 10 each illustrate respective cross-sectional views of the semiconductor device taken along the line labelled A-A' in FIG. 1, according to different embodiments.
Figure 3:
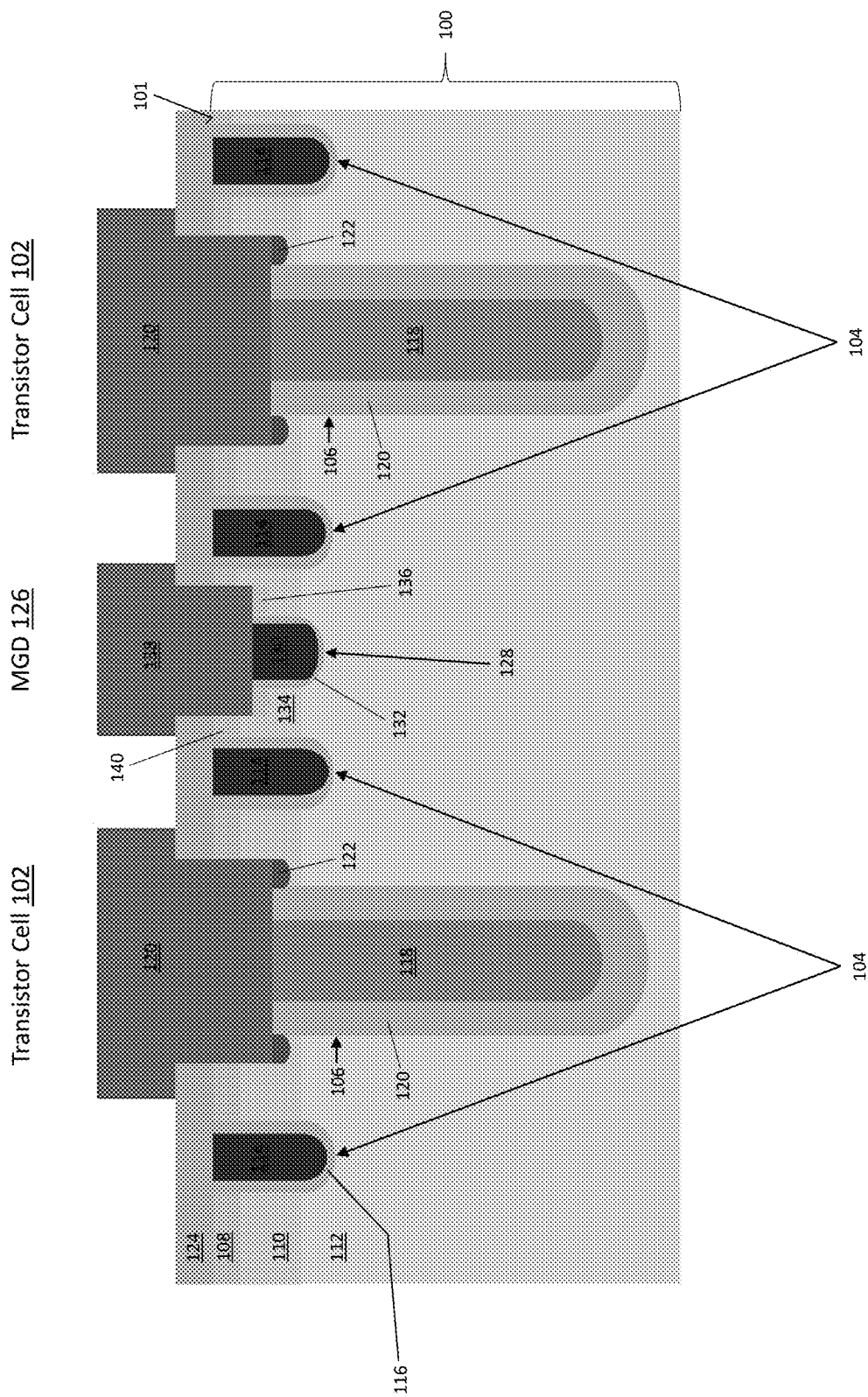
Figure 5:
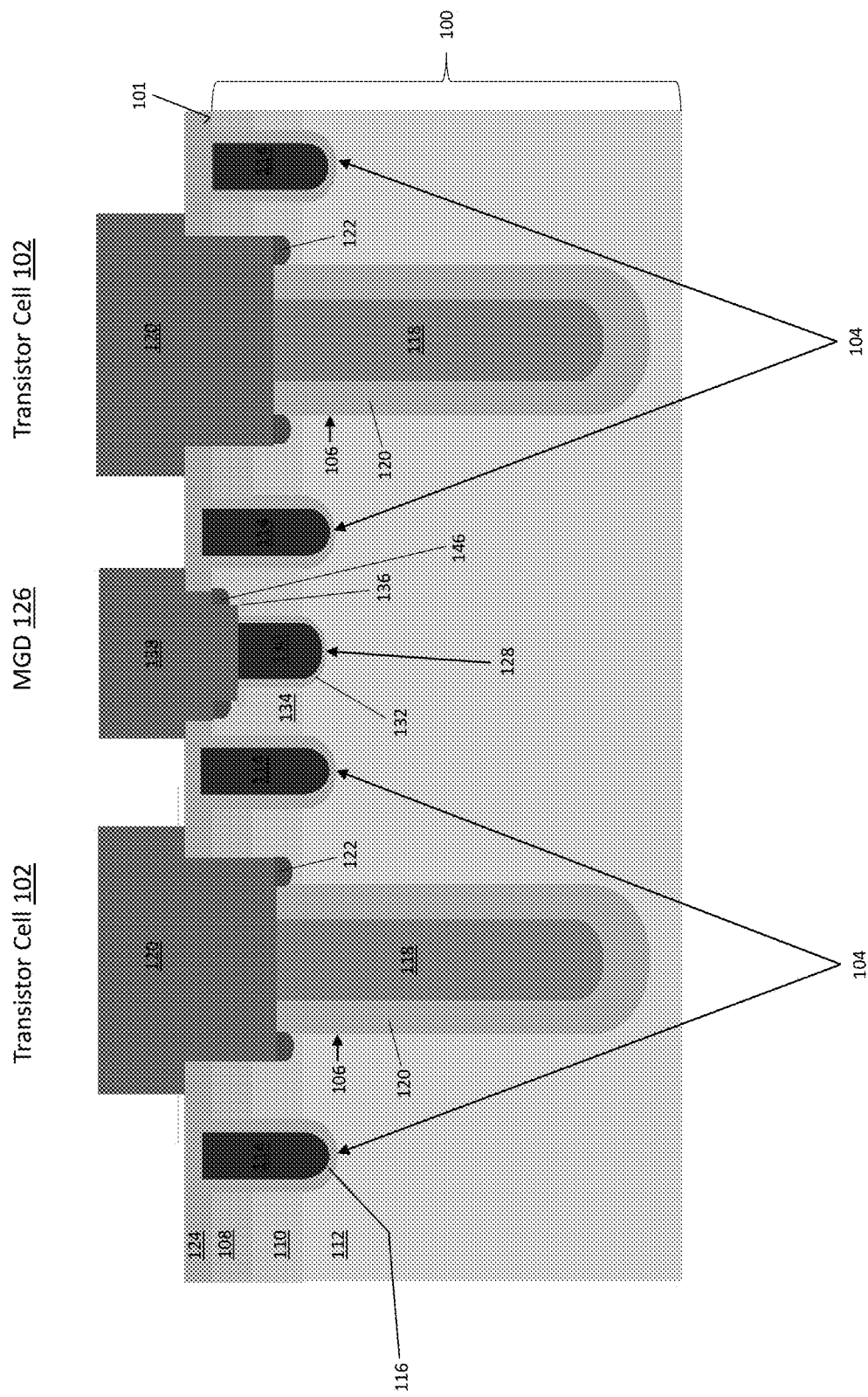

According to the MGD embodiments illustrated in FIGS. 2, 3 and 5, each MGD 126 further includes a highly doped (e.g. n+ region in the case of an n-channel device or p+ region in the case of a p-channel device) region 136 of the first conductivity type formed in the region 134 of the second conductivity type which is adjacent the electrode trench 128 of the MGD 126. A conductive material 138 such as a metal or metal alloy, doped polysilicon, etc. electrically connects the highly doped region 136 of the first conductivity type and the region 134 of the second conductivity type to the electrode 130 in the electrode trench 128 of each MGD 126. The MGD contact openings may be formed at the same time as the contact openings to the needle-shaped field electrode trench structure 106 in the transistor cells 102. The conductive material 138 may be the same metal layer 120 which contacts the needle-shaped field electrodes 120, the sides of the source regions 108, and the highly doped body contact regions 122 in the transistor cells 102. The conductive material 138 may instead be a different metal layer at the same or different potential as the metal layer 120 which contacts the needle-shaped field electrodes 118, the sides of the source regions 108, and the highly doped body contact regions 122 in the transistor cells 102. The MGD electrode trenches 128 may be recessed below the top main surface 101 of the semiconductor substrate 100 as shown in FIG. 2 to facilitate a more reliable contact between the conductive material 138 and the highly doped region 136 of the first conductivity type, the region 134 of the second conductivity type and the electrode 130 in the electrode trench 128 of each MGD 126.

According to the embodiment illustrated in FIG. 2, an additional mask (not shown) may be provided for implanting the highly doped region 136 of the first conductivity type in the region of the MGDs 126. The additional mask also blocks, in the region of the MGDs 126, the implant used to form the highly doped body contact regions 122 in the transistor cells 102. The source mask used to form the source regions 108 in the transistor cells 102 may be modified to block the source implant in the region of the MGDs 126.

The MGD embodiment shown in FIG. 3 differs from the embodiment shown in FIG. 2 in that each MGD 126 further includes an additional region 140 of the first conductivity type formed in the region 134 of the second conductivity type which is adjacent the electrode trench 128 of the MGD 126. The additional region 140 of the first conductivity type may be formed using the same mask used to form the source regions 108 in the transistor cells 102. That is, unlike the embodiment illustrated in FIG. 2, the source mask used to form the source regions 108 in the transistor cells 102 is not modified to block the source implant in the region of the MGDs 126. The overlying conductive material 138 contacts both the highly doped region 136 of the first conductivity type and the additional region 140 of the first conductivity type, according to this embodiment.

Figure 4:
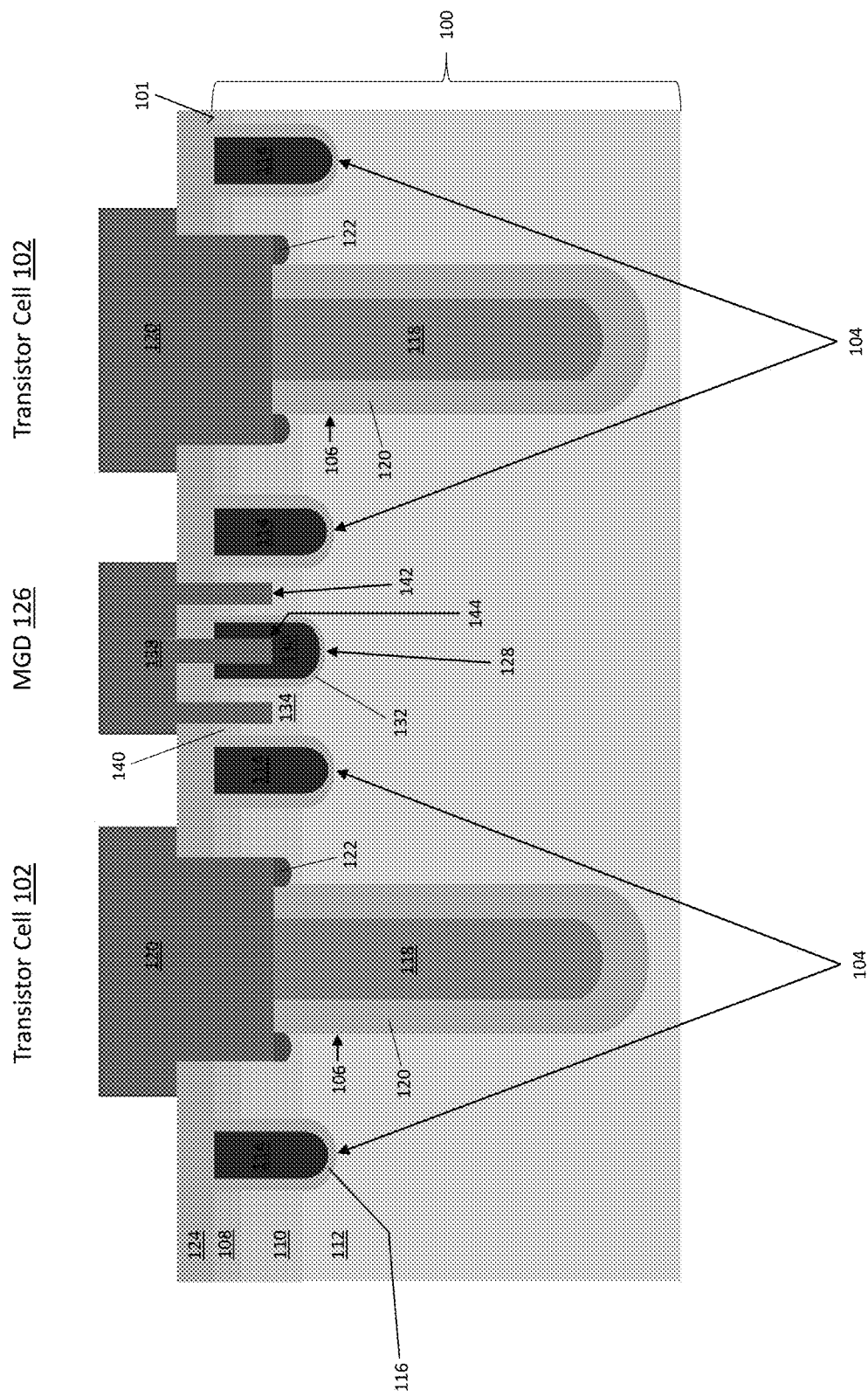

The MGD embodiment shown in FIG. 4 differs from the embodiment shown in FIG. 3 in that each MGD 126 further includes a contact trench 142 laterally surrounding the electrode trench 128 and laterally spaced apart from the gate trench structures 104 of the four adjacent transistor cells 102. The MGD contact trenches 142 may extend through the upper region 140 of the first conductivity type and into the lower region 134 of the second conductivity type. The MGD contact trenches 142 are filled with the conductive material 138 which contacts region 140 of the first conductivity type and the electrode 130 in the electrode trench 128 of the MGD 126. The highly doped region 136 of the first conductivity type may be omitted according to this embodiment. Separately or in combination, the MGD electrode trenches 128 may not be recessed below the top main surface 101 of the semiconductor substrate as shown in FIG. 4. An additional contact trench 144 may be formed in the electrode 130 of each MGD electrode trench 128, and the conductive material 138 may fill the additional trench 144 to contact the electrode 130 in the respective electrode trenches 128 of the MGDs 126.

The MGD embodiment shown in FIG. 5 differs from the embodiment shown in FIG. 2 in that each MGD 126 further includes a highly doped region 146 (e.g. p+ region in the case of an n-channel device or n+ region in the case of a p-channel device) of the second conductivity type formed in the region 134 of the second conductivity type which is adjacent the electrode trench 128 of the MGD 126. The highly doped region 146 of the second conductivity type is doped more heavily than the region 134 of the second conductivity type which is adjacent the electrode trench 128 of the MGD 126, and the conductive material 138 also contacts the highly doped region 146 of the second conductivity type.

FIGS. 6A through 6K illustrate respective partial cross-sectional views during different stages of a method of manufacturing the semiconductor device, and in which a MGD 200 is formed at each intersection of four adjacent transistor cells 202. One MGD 200 and two neighboring transistor cells 202 are shown in FIGS. 6A through 6K.

Figure 6A:
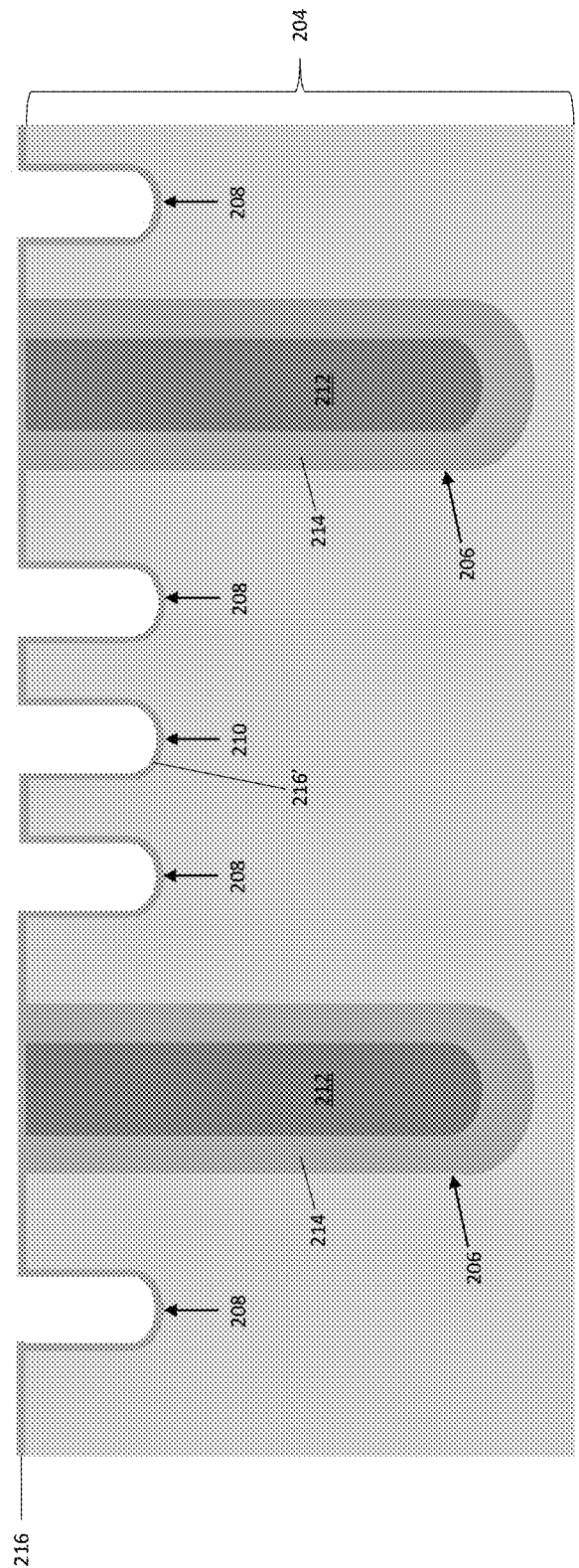
FIGS. 6A through 6K illustrate respective partial cross-sectional views during different stages of a method of manufacturing a semiconductor device in which a MGD is formed at each intersection of four adjacent transistor cells.

FIG. 6A shows a semiconductor substrate 204 after needle-shaped field electrode trench structures 206, gate trenches 208 and MGD electrode trenches 210 are formed in the semiconductor substrate 204. The needle-shaped field electrode trench structures 206 may include a needle-shaped field electrode 212 insulated from the surrounding semiconductor substrate 204 by a field dielectric 214 such as a field oxide.

The gate and MGD electrode trenches 208, 210 may be formed by a typical etching process. In one embodiment, the MGD electrode trenches 210 are etched into the semiconductor substrate 204 at the same time as the gate trenches 208 of the transistor cells 202 using a common trench etching process. A dielectric 216 is also formed in the gate and MGD electrode trenches 208, 210, e.g., by thermal oxidation, oxide deposition, etc. The dielectric 216 forms a dielectric liner 216' in the MGD electrode trenches 210 and is thinner than the gate trench dielectric to be formed in the transistors cells 202, according to this embodiment.

Figure 6B:
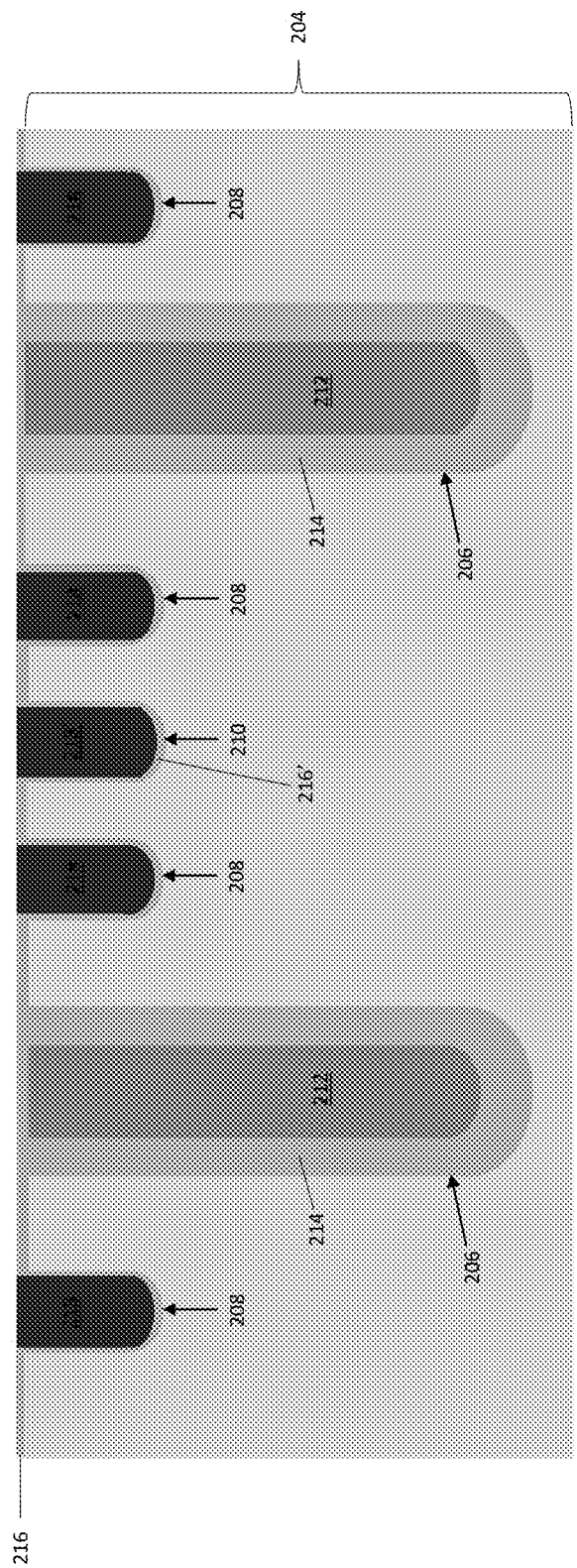

FIG. 6B shows the semiconductor substrate 204 after the gate trenches 208 and the MGD electrode trenches 210 are filled with an electrically conductive material such as a metal or metal alloy, doped polysilicon, etc. The electrically conductive material 218 is planarized, e.g. by chemical-mechanical polishing (CMP) to form the MGD trench electrodes 218'.

Figure 6C:
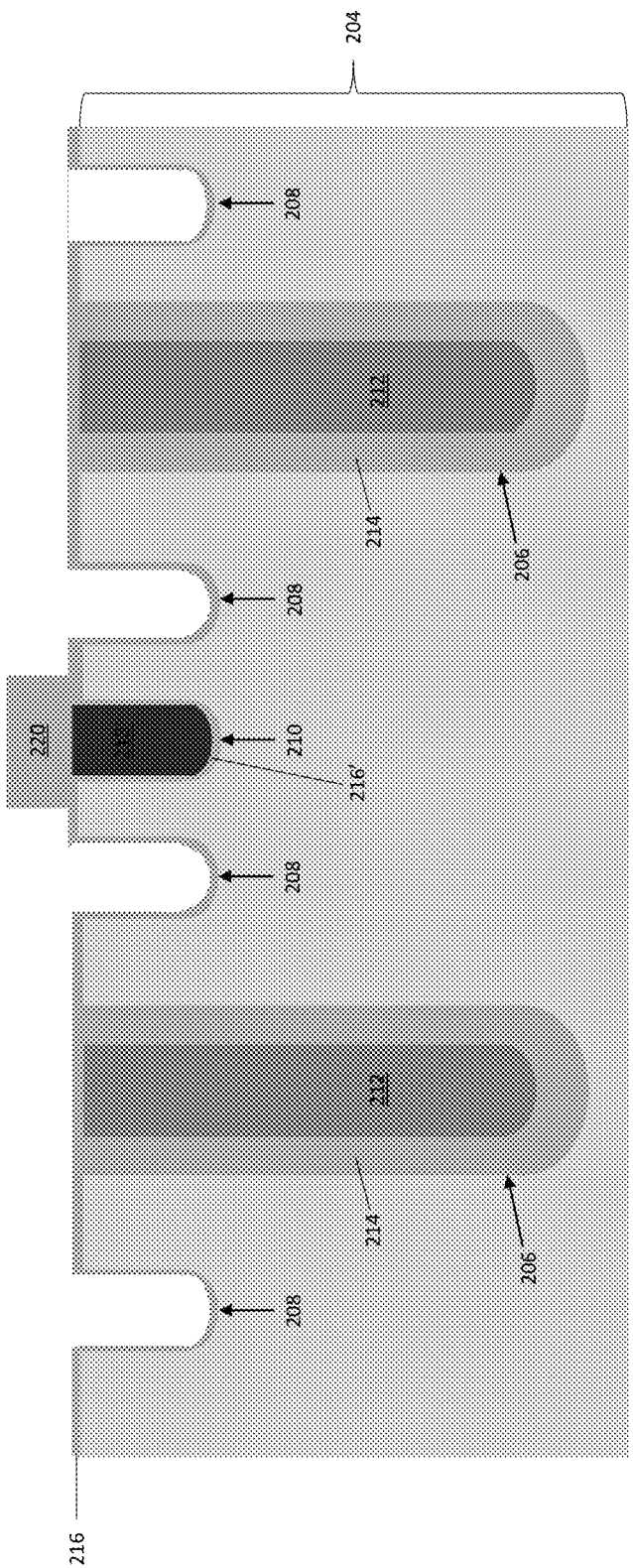

FIG. 6C shows the semiconductor substrate 204 after a mask 220 such as silicon dioxide, silicon nitride, photoresist, etc. is formed over the MGD electrode trenches 210 to protect the electrodes 218' and the dielectric 216' in the MGD electrode trenches 210. The electrically conductive material 218 is then removed from the unprotected gate trenches 208 in the transistors cells 102 using a typical etching process such as wet or dry chemical etching.

Figure 6D:
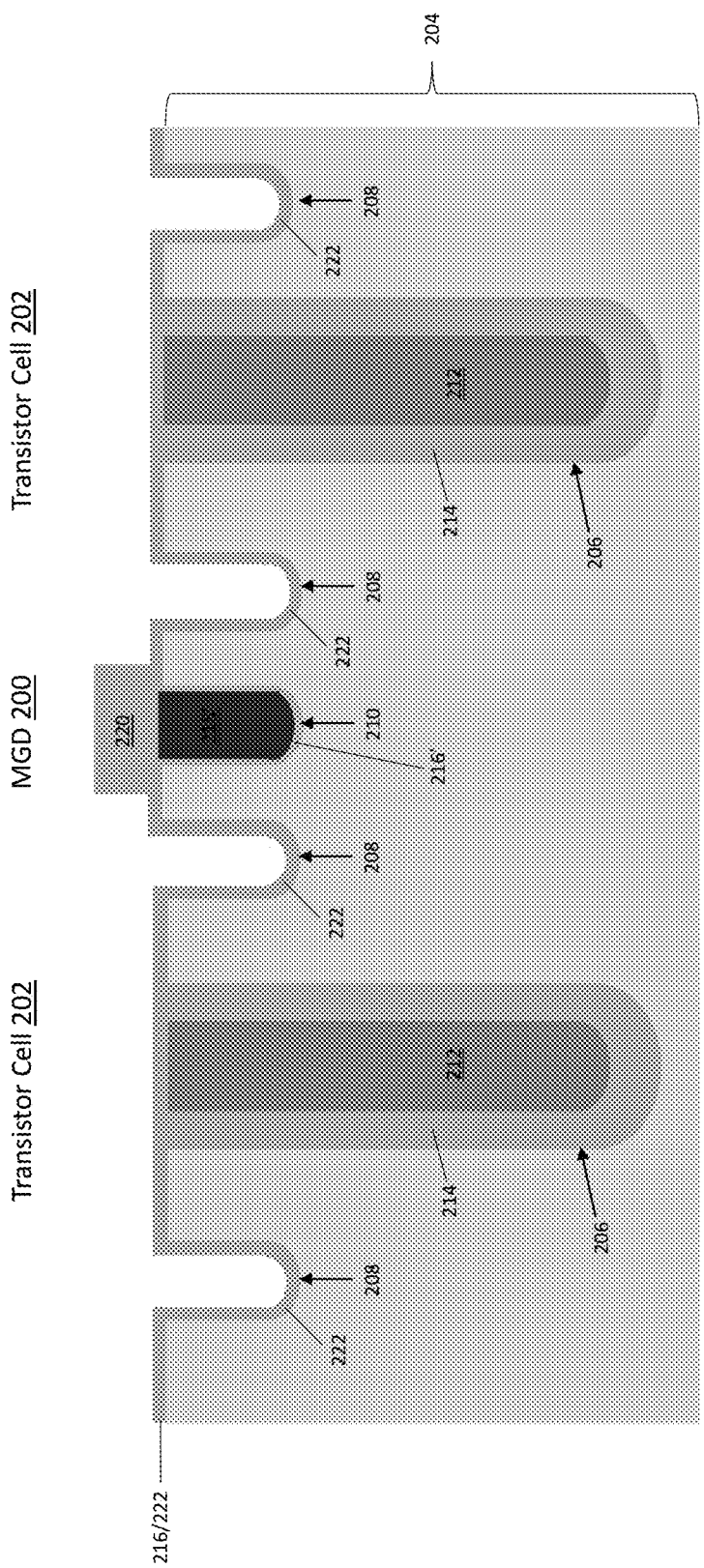

FIG. 6D shows the semiconductor substrate 204 after a gate dielectric 222 is formed in the gate trenches 208 of the transistor cells 202. The dielectric 216 which forms the dielectric liner 216' in the MGD electrode trenches 210 may be removed from the gate trenches 208 prior to formation of the gate dielectric 222, or the gate dielectric may be deposited on the underlying dielectric 216 if still present at the time of gate dielectric formation. The gate oxide 222 may be formed by a typical oxide formation process such as thermal oxidation, deposition, etc. As mentioned above, the MGD trench dielectric 216' is thinner than the gate trench dielectric 222 in the transistor cells 202 according to this embodiment, for example by a factor of about 10× or more, to ensure proper operation of the MGDs 200. Typical gate dielectric thickness of about 60 nm or more may be too thick to ensure proper MGD operation. Hence, the separate MGD oxide formation process. If the gate dielectric material and thickness is sufficient to ensure proper MGD operation, the separate MGD oxide formation process may be omitted.

Figure 6E:
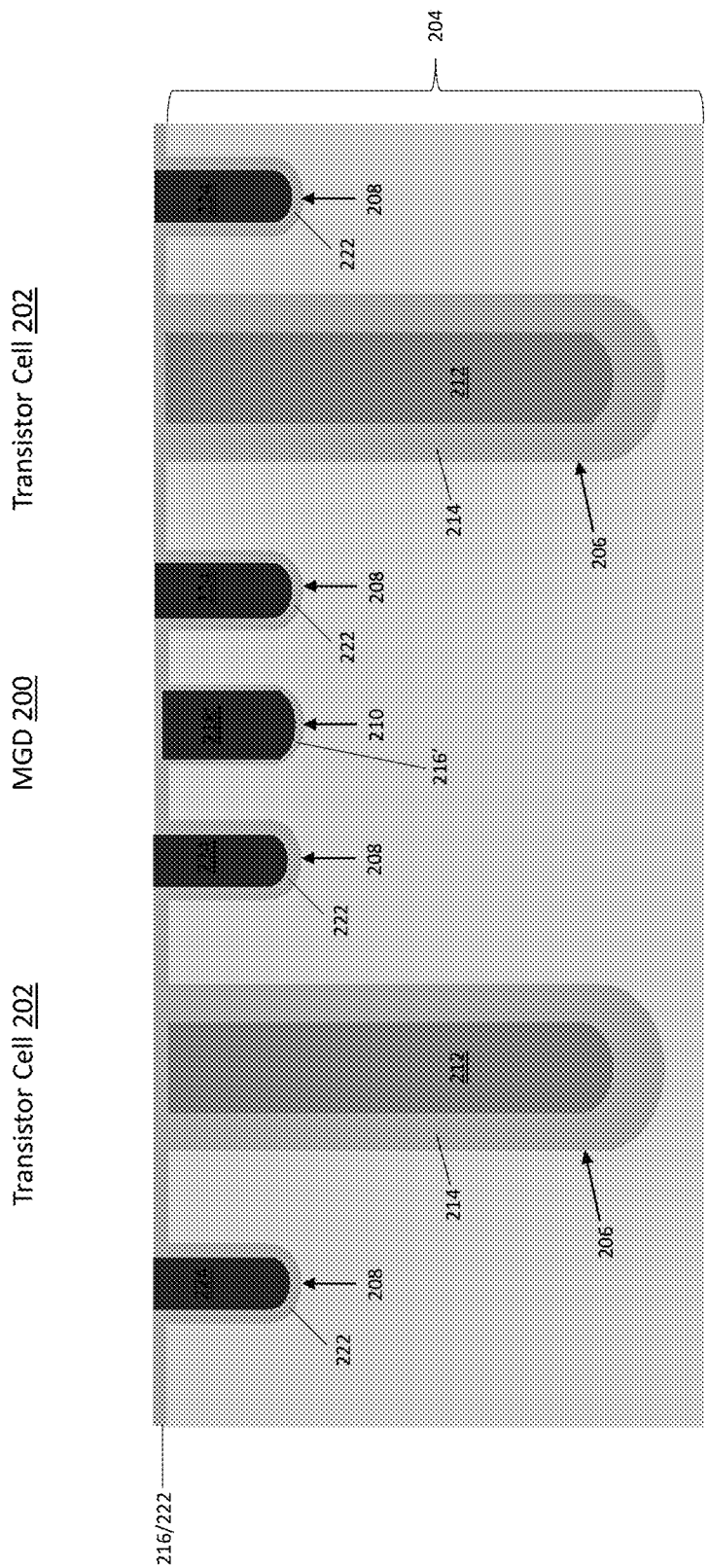

FIG. 6E shows the semiconductor substrate 204 after planarization of the gate dielectric 222, e.g. by CMP, removal of the MGD mask 220, and filling the gate trenches 108 with an electrically conductive material such as a metal or alloy, doped polysilicon, etc. The electrically conductive material is planarized, e.g. by CMP to form gate electrodes 224 of the transistor cells 202.

Figure 6F:
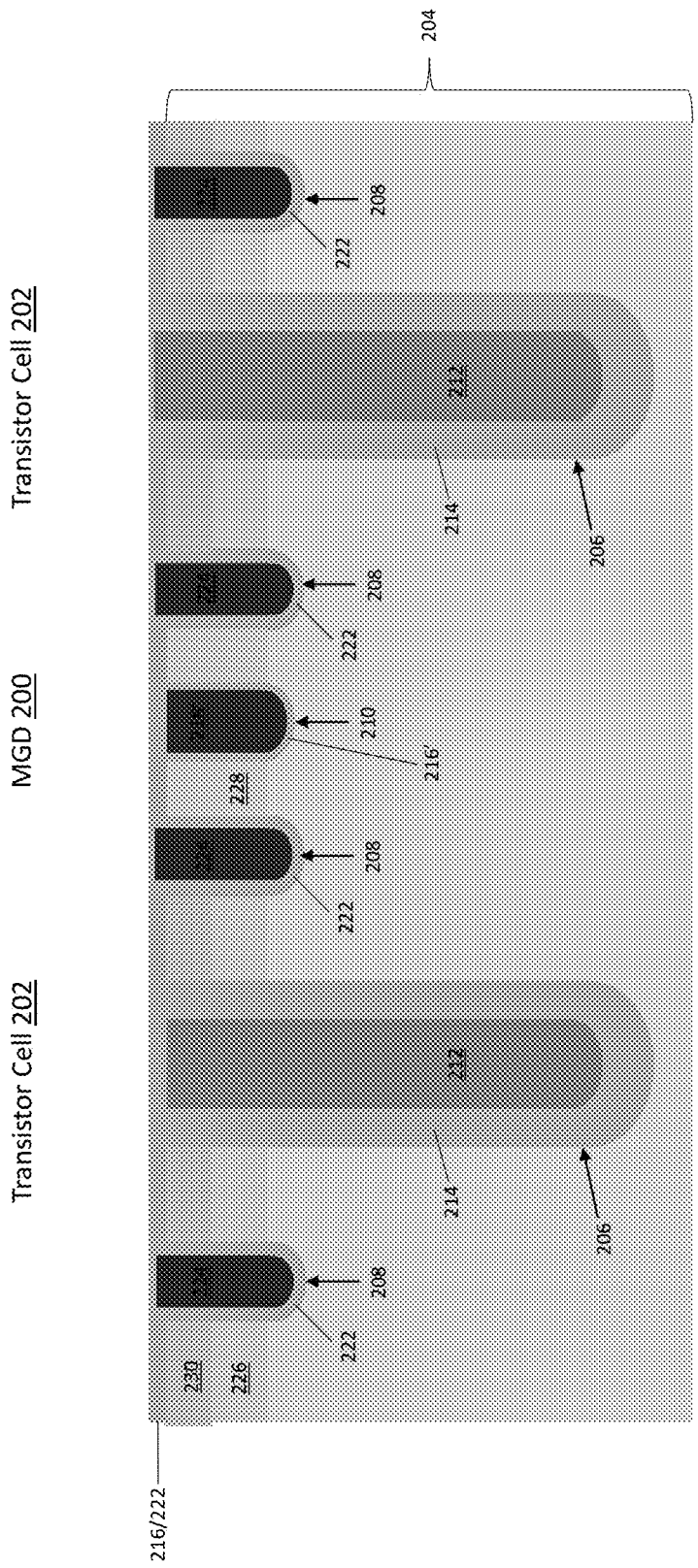

FIG. 6F shows the semiconductor substrate 204 after implantation of body dopants of the second conductivity into the transistor cells 202 and the MGDs 200 using a common body implantation process, and after implantation of source dopants of the first conductivity into the transistor cells 202 but not the MGDs 200. The implanted dopants are annealed at some point to form body regions 226 of the second conductivity in the transistor cells 202 and a region 228 of the second conductivity type in the MGDs 200, and to form source regions 230 of the first conductivity type in the transistor cells 202 but not in the MGDs 200. The source implantation mask (not shown) may be modified to block implantation of the source dopants into the MGDs 200.

Figure 6G:
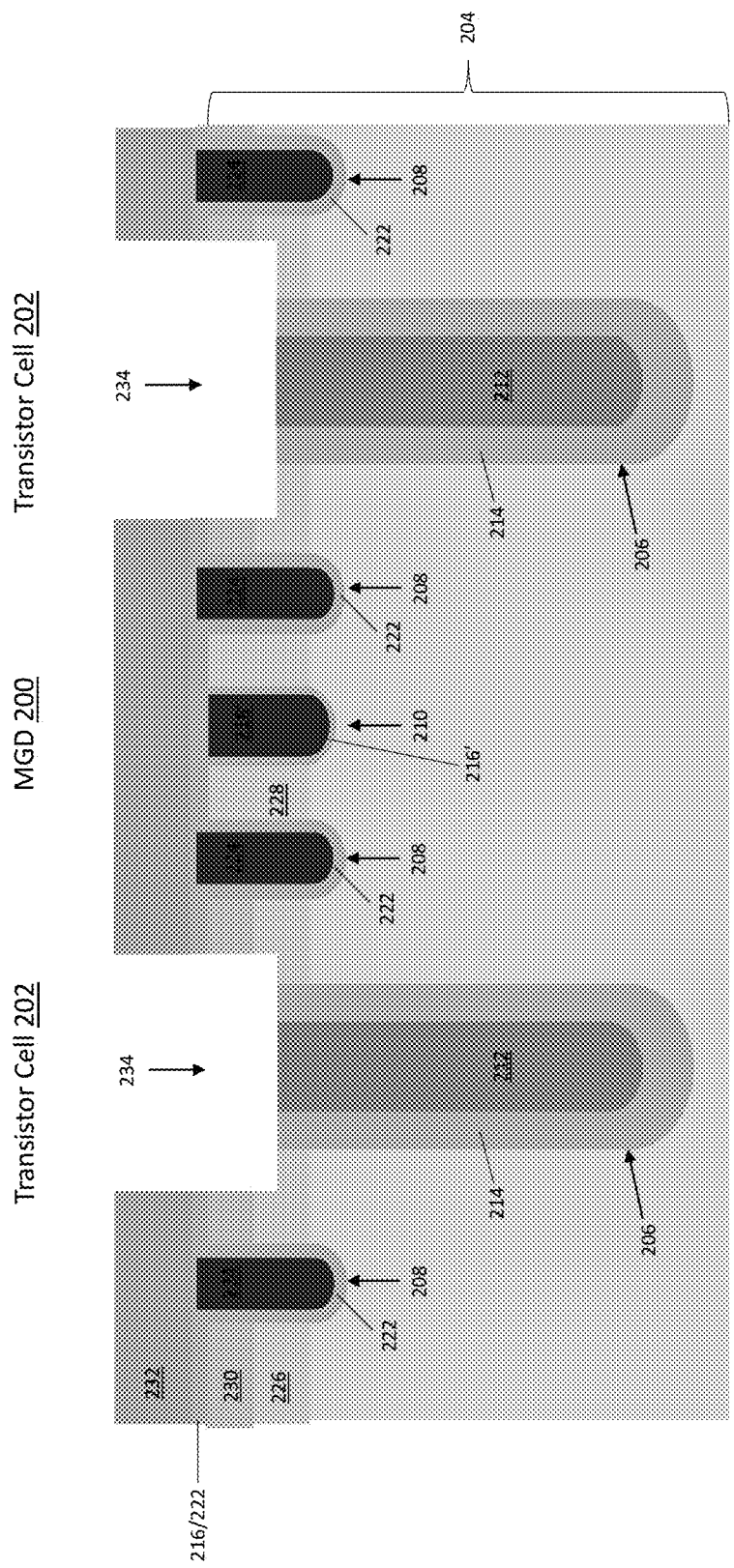

FIG. 6G shows the semiconductor substrate 204 after a contact mask 232 such as silicon dioxide, silicon nitride, photoresist, etc. is formed on the dielectric material 216/222 remaining on the top main surface of the semiconductor substrate 204, and after etching contact openings 234 through the dielectric material 216/222 and into the semiconductor substrate 204 in regions exposed by openings in the contact mask 200. Any typical dielectric and semiconductor etching processes may be used to form the contact openings 234 to the transistor cells 202.

Figure 6H:
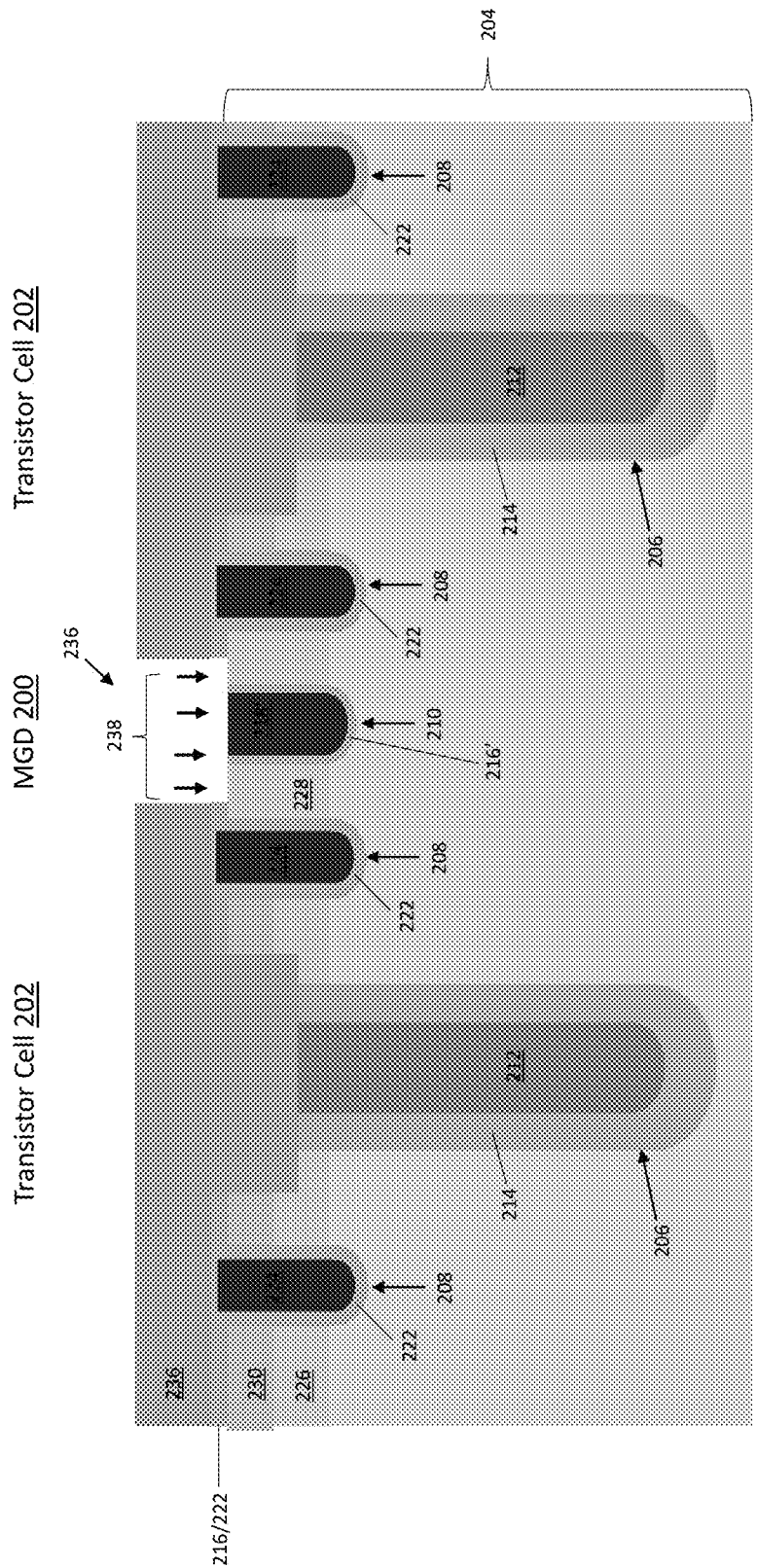

FIG. 6H shows the semiconductor substrate 204 after the transistor cell contact mask 232 is removed and an MGD implantation mask 236 such as silicon dioxide, silicon nitride, photoresist, etc. is formed and which has openings 236' that expose MGD regions of the device. The dielectric material 216/222 which remains on the top main surface of the semiconductor substrate 204 and is exposed by the openings in the MGD implantation mask 236 is removed, e.g. by etching. The exposed part of the MGD regions are then implanted with a dopant species 238 of the second conductivity type to adjust the threshold in the MGD regions of the device. This step may be omitted if MGD threshold adjustment is not required.

Figure 6I:
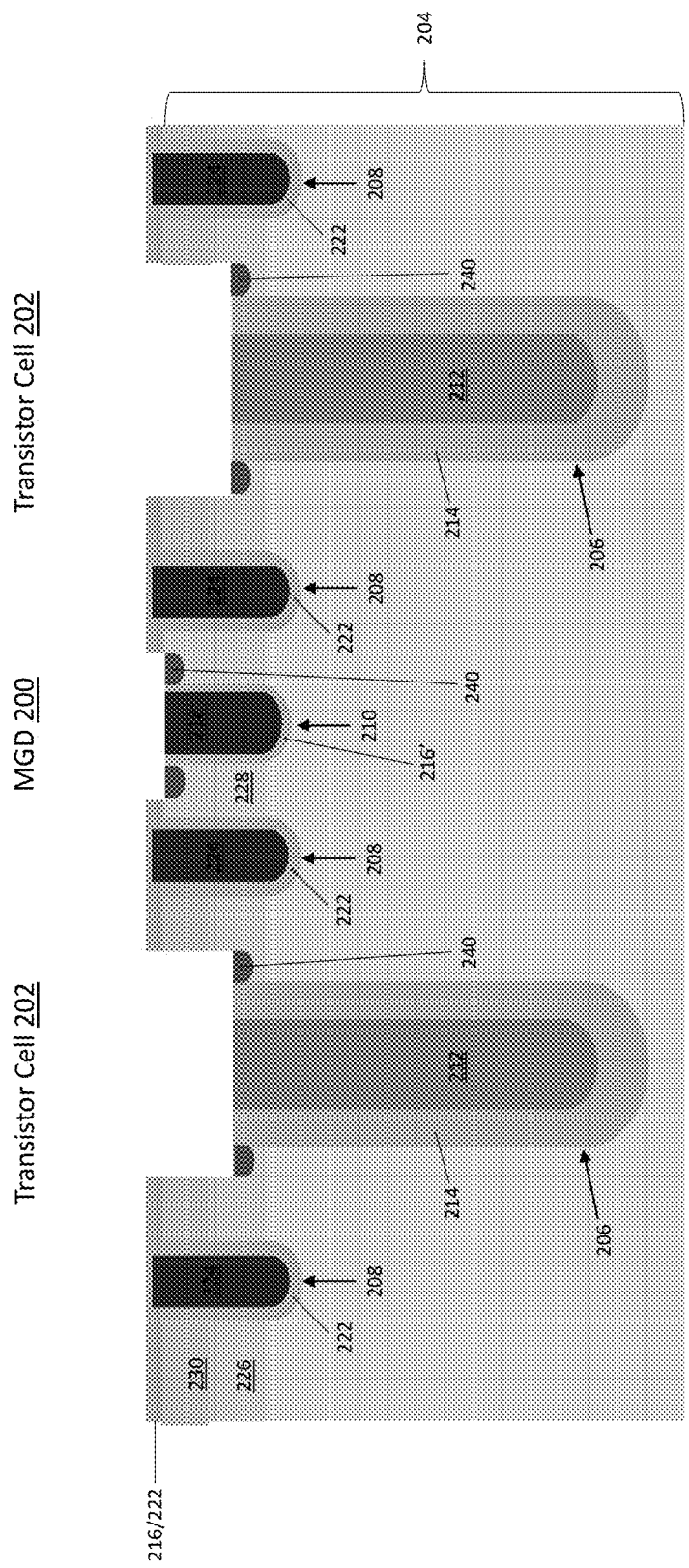

FIG. 6I shows the semiconductor substrate 204 after highly doped contact regions 240 of the second conductivity type are formed in the transistor cells 202 and in the MGDs 200 of the device. The highly doped contact regions 240 enable low ohmic contact with the body region 226 of the second conductivity type in the transistor cells 202, and with the region 228 of the second conductivity type of the MGDs 200.

Figure 6J:
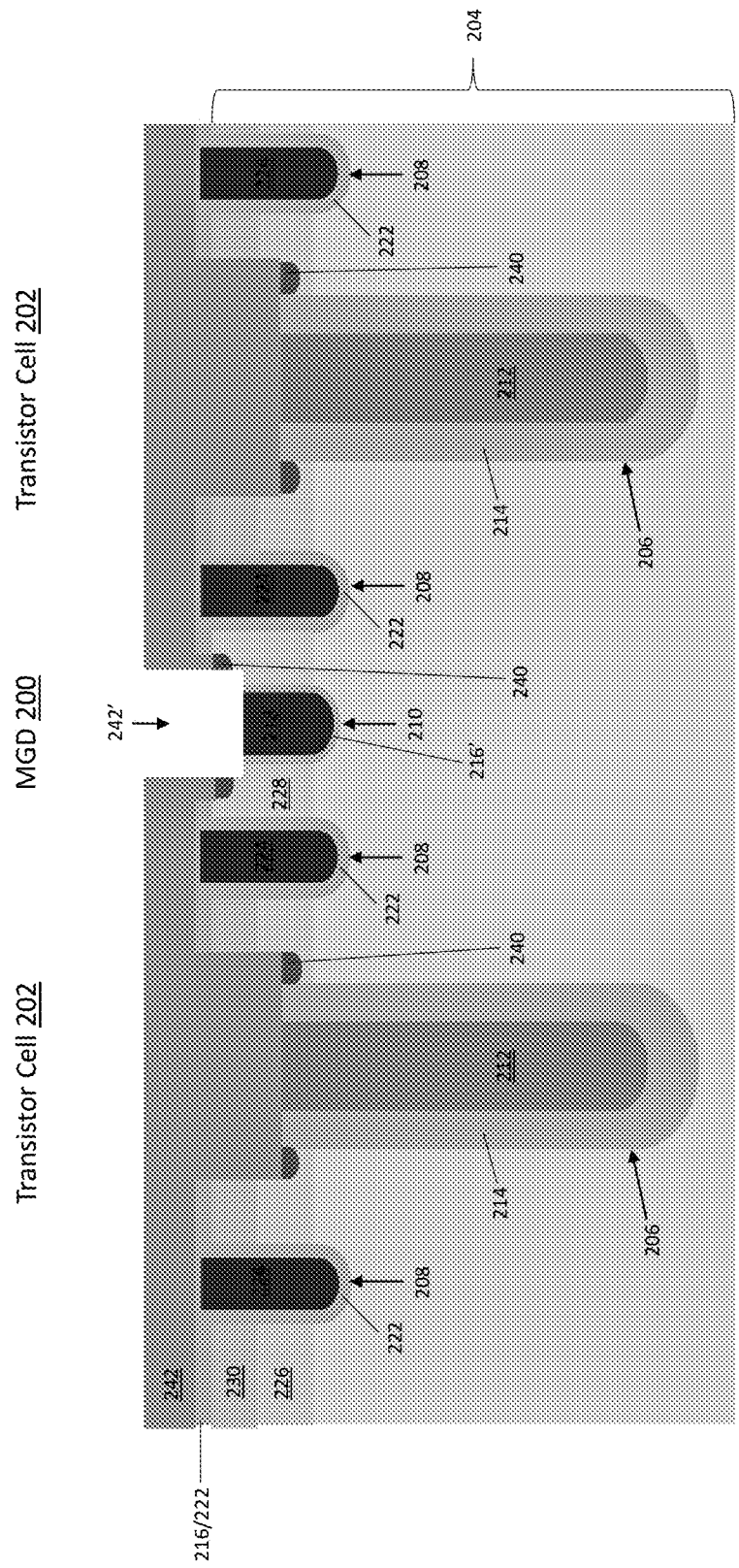

FIG. 6J shows the semiconductor substrate after formation of an MGD contact mask 242 such as a photoresist. The MGD contact mask 242 has openings 242' which are vertically aligned with the electrode trenches 210 of the MGDs 200. The exposed part of the semiconductor substrate 204 in the MGD regions, including a section of the highly doped contact regions 240 of the second conductivity type, is then etched to reduce the thickness of the more lightly doped region 228 of the second conductivity type disposed along sidewalls of the MGD electrode trenches 210 and thereby provide a shallower contact depth for the MGDs 200. The shallower contact depth ensures the channel length of the MGDs 200 is comparable to the channel length of the transistor cells 202.

Figure 6K:
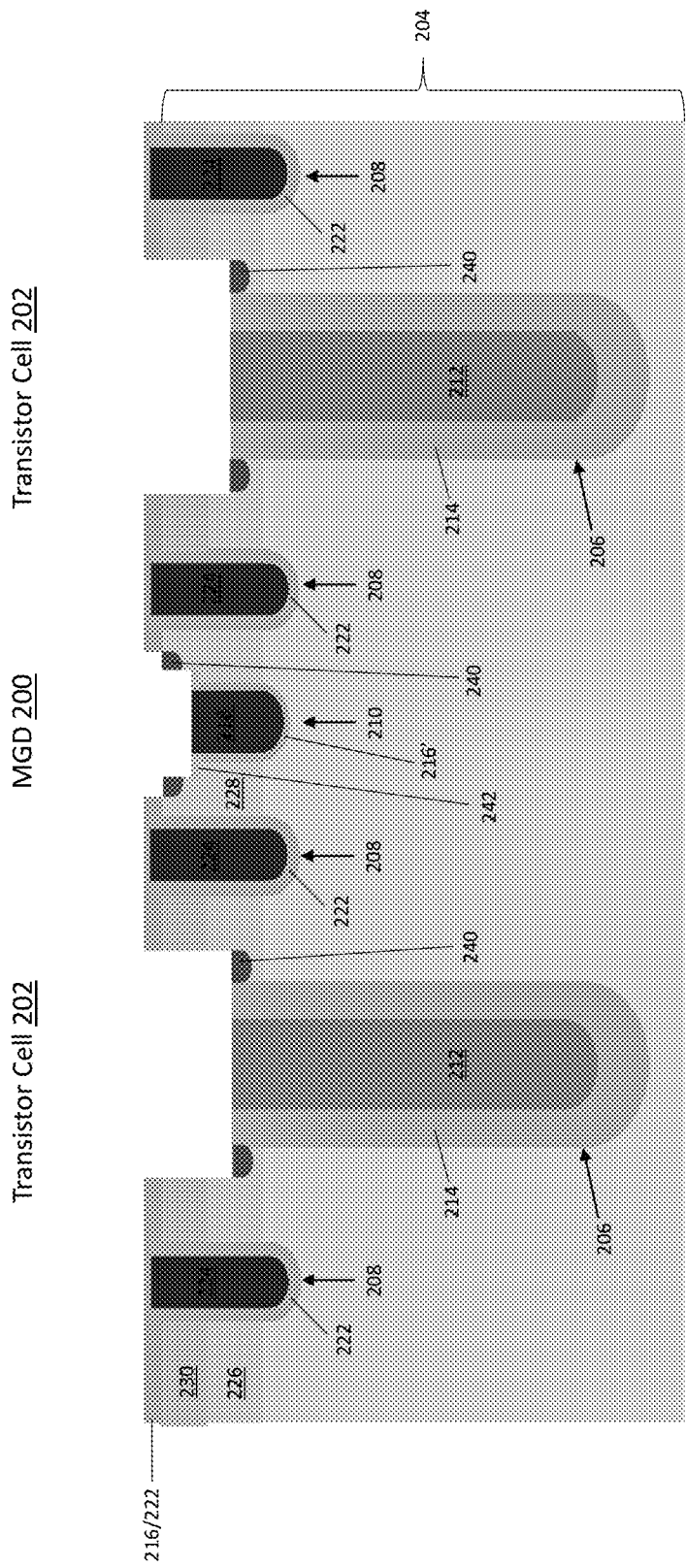

FIG. 6K shows the semiconductor substrate 204 after dopants of the first conductivity type are implanted into the recessed part of the more lightly doped MGD region 228 of the second conductivity type. The MGD contact mask 242 is then removed and the semiconductor substrate 204 annealed to form the highly doped regions 244 of the MGDs 200.

The contact openings formed in the transistor cells 202 and in the MGDs 200 may then be filled with an electrically conductive material such as a metal or metal alloy, doped polysilicon, etc. to form respective contacts to the transistor cells 202 and MGDs 200. The resulting semiconductor device formed by the manufacturing method illustrated in FIGS. 6A through 6K is shown in FIG. 5.

The manufacturing method illustrated in FIGS. 6A through 6K may be modified to instead form any of the semiconductor devices shown in FIGS. 2 through 4. For example, to manufacture the semiconductor device shown in FIG. 2, an additional mask may be provided for implanting a highly doped region of the first conductivity type in the region of the MGDs 200. This mask also blocks, in the region of the MGDs 200, the implant used to form the highly doped body contact regions 240 in the transistor cells 202, and the source mask used to form the source regions 230 in the transistor cells 202 may be modified to block the source implant in the region of the MGDs 200. To manufacture the semiconductor device shown in FIG. 3, an additional region of the first conductivity type may be formed using the same mask used to form the source regions 230 in the transistor cells 202. To manufacture the semiconductor device shown in FIG. 4, a contact trench may be etched into the semiconductor substrate 204 in each MGD 200. The contact trench laterally surrounds the corresponding MGD electrode trench 210, and is laterally spaced apart from the gate trenches 208 of the four adjacent transistor cells 202 which adjoin the MGD 200.

FIGS. 7 through 10 illustrate respective embodiments in which a Schottky diode instead of an MGD is formed in a semiconductor substrate of a semiconductor device at the intersection of four adjacent transistor cells.

Figure 7:
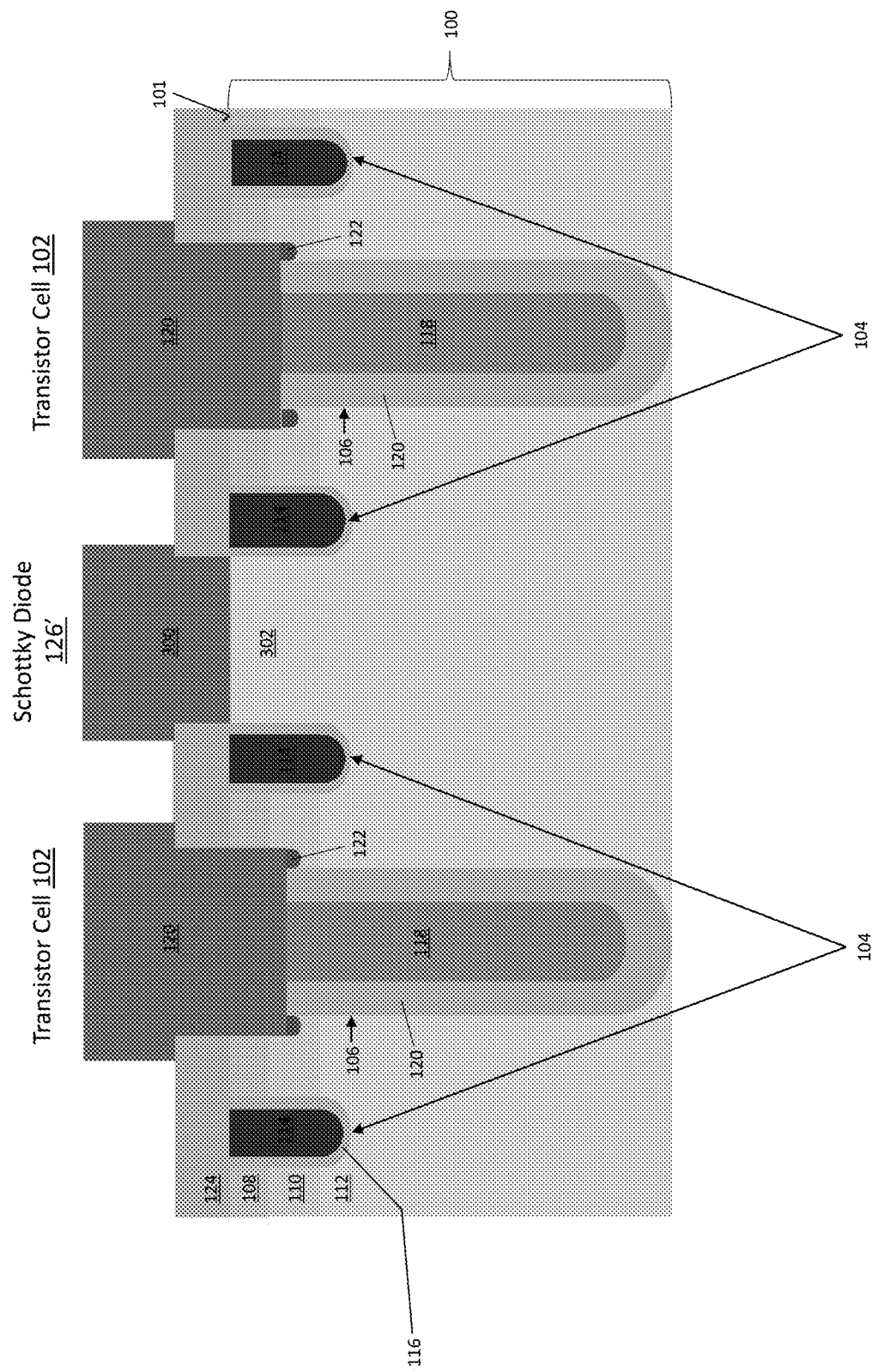

According to the Schottky diode embodiment illustrated in FIG. 7, each Schottky diode 126' at the intersection of four adjacent transistor cells 102 includes a metal or metal alloy 300 in direct contact with a region 302 of the semiconductor substrate 100 of the first conductivity type. The result of this contact is a Schottky barrier (rectifying contact), where the junction conducts for one bias polarity but not the other. The metal or metal alloy 300 may be the same or different metal layer as the metal layer 120 which contacts the needle-shaped field electrodes 118, the source regions 108, and the highly doped body contact regions 122 in the transistor cells 102. The Schottky diode 126' may be formed by modifying the masks used to implant the source and body regions 108, 110 in the transistors cells 102, to block the source and body implants in the region of the Schottky diodes 126'. An additional mask (not shown) may be used to block, in the region of the Schottky diodes 126', the implant used to form the highly doped body contact regions 122 in the transistor cells 102.

Figure 8:
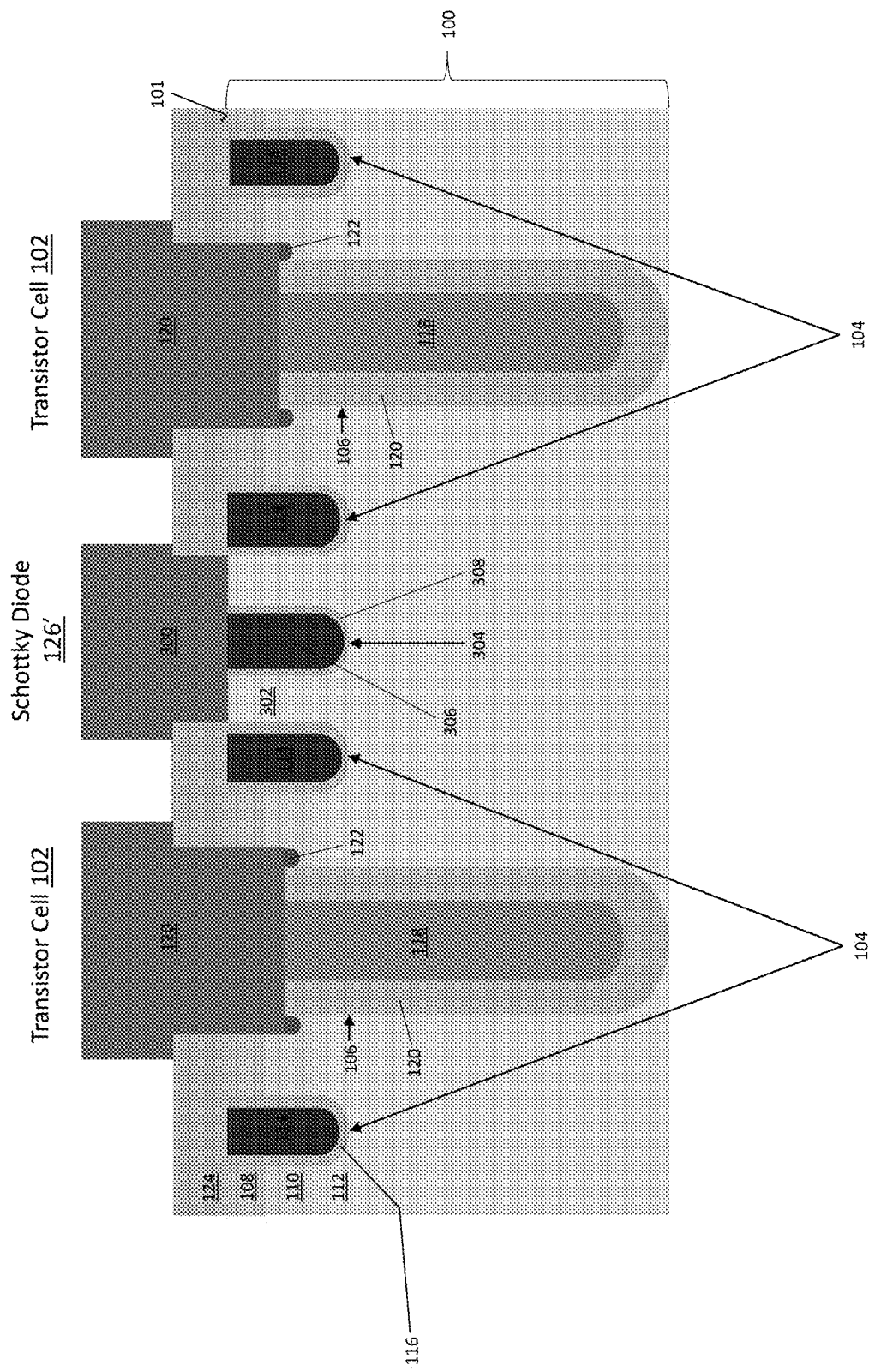

The Schottky diode embodiment shown in FIG. 8 differs from the embodiment shown in FIG. 7 in that each Schottky diode 126' further includes an electrode trench 304 formed in the semiconductor substrate 100 and laterally spaced apart from the gate trench structures 104 of the four adjacent transistor cells 102. The Schottky barrier is still provided by the contact between the metal or metal alloy 300 and the region 302 of the semiconductor substrate 100 of the first conductivity type. However, the metal or metal alloy 300 also electrically connects an electrode 306 in the Schottky electrode trench 304 to the region 302 of the semiconductor substrate 100 of the first conductivity type disposed adjacent the Schottky electrode trench 304. The electrode 306 in each Schottky electrode trench 304 is insulated from the surrounding semiconductor substrate 100 by a dielectric 308 such as an oxide.

The Schottky diode embodiment shown in FIG. 9 differs from the embodiment shown in FIG. 8 in that a region 310 of the semiconductor substrate 100 of the second conductivity type is disposed adjacent the electrode trench 304 of each Schottky diode 126', below the region 302 of the semiconductor substrate 100 of the first conductivity type.

The Schottky region 310 of the second conductivity type may be formed by the same implantation process used to form the body regions 110 in the transistor cells 102. The Schottky barrier is again provided by the contact between the metal or metal alloy 300 and the region 302 of the semiconductor substrate 100 of the first conductivity type. The metal or metal alloy 300 also electrically connects the electrode 306 in the Schottky electrode trench 304 to both the region 310 of the semiconductor substrate 100 of the second conductivity type adjacent the Schottky electrode trench 304 and the overlying region 302 of the semiconductor substrate 100 of the first conductivity type. The overlying region 302 of the first conductivity type may be formed using the same mask used to form the source regions 108 in the transistor cells 102. The electrode trenches 304 of the Schottky diodes 126' may be recessed below the top main surface 101 of the semiconductor substrate 100. For example, a section of the region 310 of the semiconductor substrate 100 of the second conductivity type adjacent each Schottky electrode trench 304 and a section of the overlying region 302 of the semiconductor substrate 100 of the first conductivity type may be recessed below the top main surface 101 of the semiconductor substrate 100.

Figure 9:
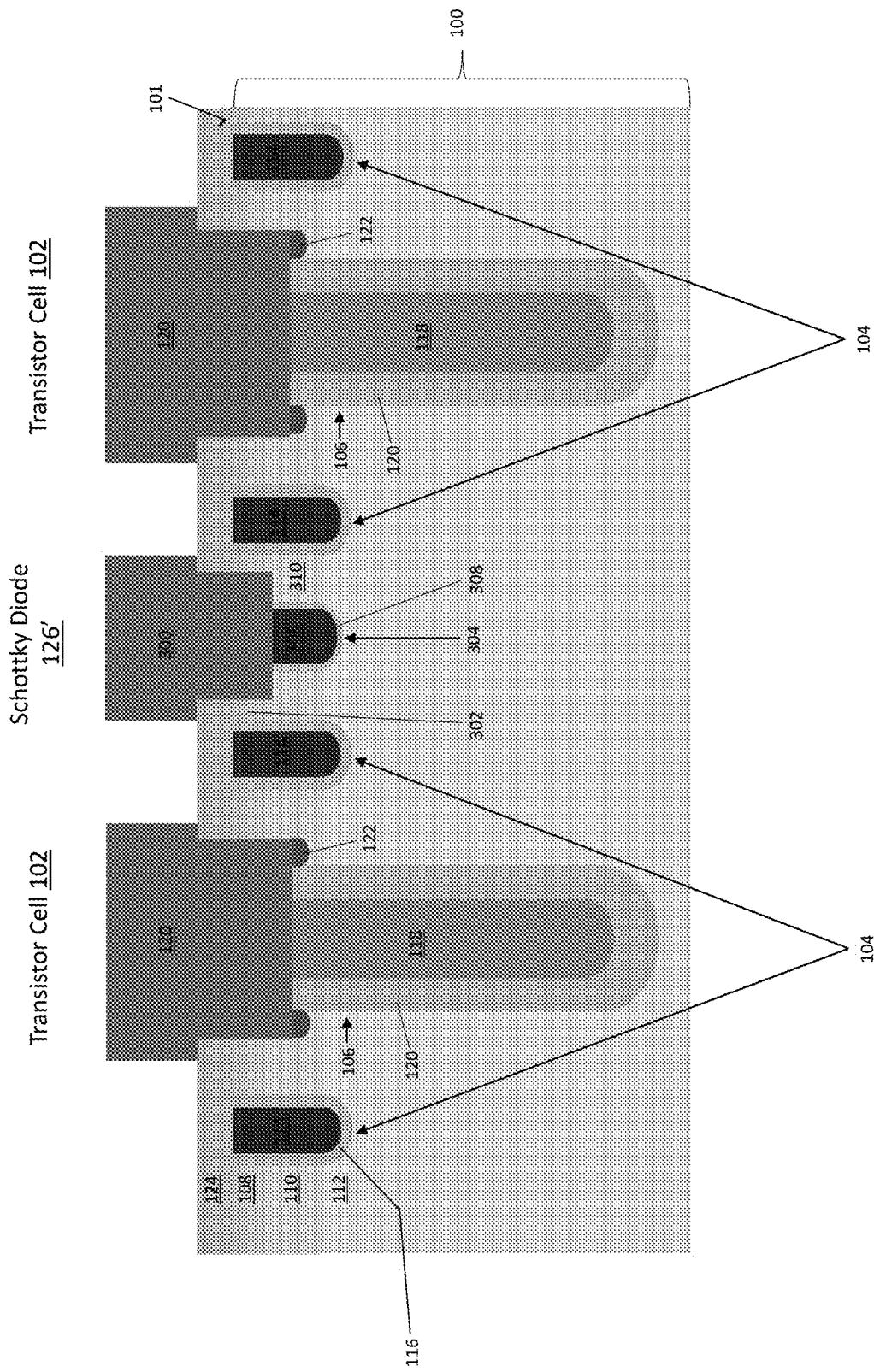
Figure 10:
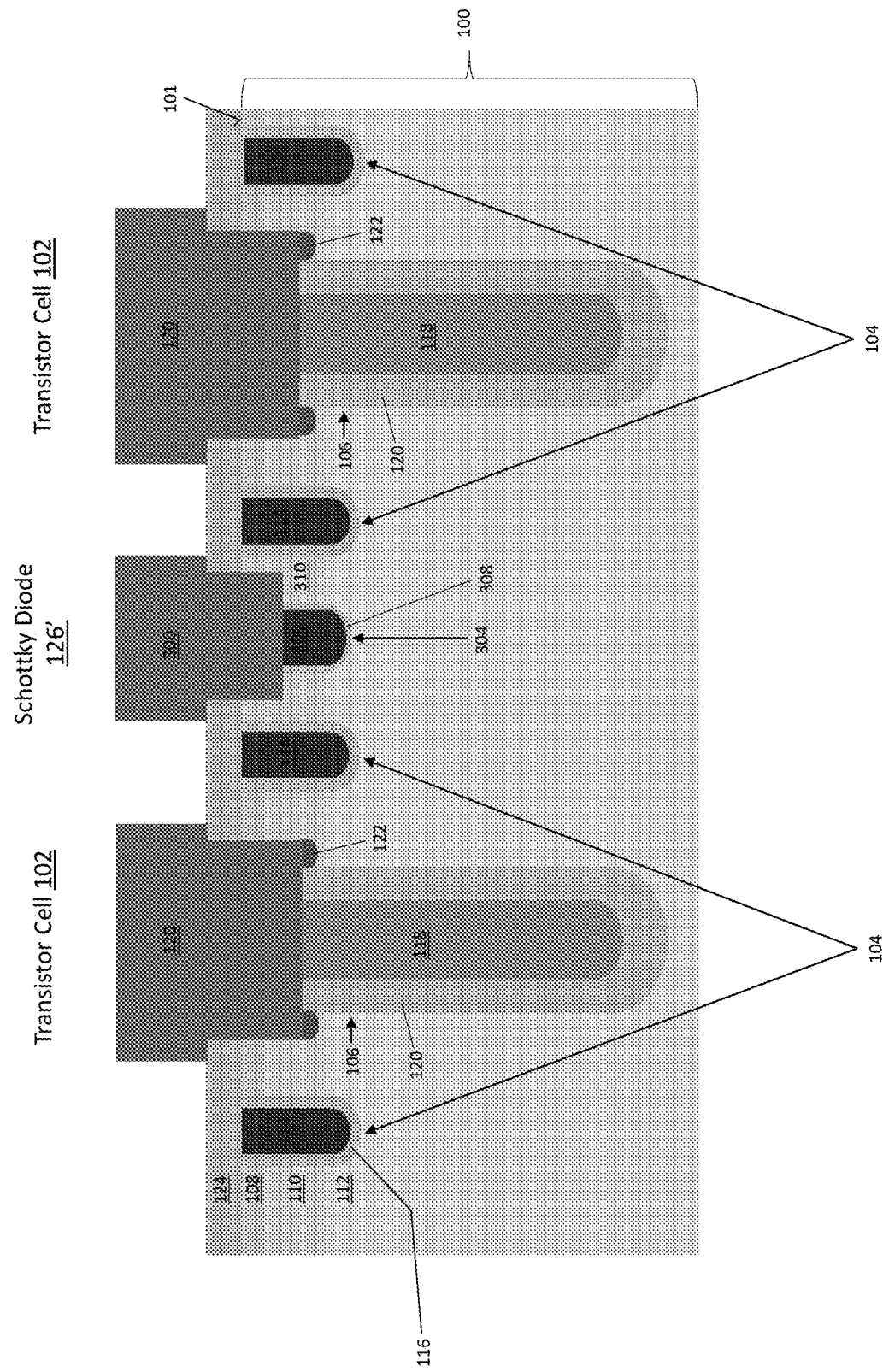

The Schottky diode embodiment shown in FIG. 10 differs from the embodiment shown in FIG. 9 in that the region 302 of the semiconductor substrate 100 of the first conductivity type disposed above the region 310 of the semiconductor substrate 100 of the second conductivity type adjacent each Schottky electrode trench 304 is omitted. The overlying region 302 of the first conductivity type may be omitted by modifying the mask used to form the source regions 108 in the transistor cells 102. According to this embodiment, the Schottky barrier is provided by the contact between the metal or metal alloy 300 and the region 310 of the semiconductor substrate 100 of the second conductivity type. The electrode trenches 304 of the Schottky diodes 126' may or may not be recessed below the top main surface 101 of the semiconductor substrate 100 according to this embodiment.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   a semiconductor substrate;
   a plurality of transistor cells, each transistor cell comprising:
      a gate trench structure formed in the semiconductor substrate and circumscribing the transistor cell;
      a needle-shaped field electrode trench structure formed in the semiconductor substrate and spaced inward from the gate trench structure;
      a source region of a first conductivity type formed in the semiconductor substrate adjacent the gate trench structure;
      a body region of a second conductivity type opposite the first conductivity type formed in the semiconductor substrate below the source region; and
      a drift zone of the first conductivity type formed in the semiconductor substrate below the body region; and
   a plurality of MOS-gated diodes or Schottky diodes, each diode of the plurality of MOS-gated diodes or Schottky diodes formed outside the plurality of transistor cells and in the semiconductor substrate at an intersection of four adjacent transistor cells.

2. The semiconductor device of claim 1, wherein each MOS-gated diode of the plurality of MOS-gated diodes is formed in the semiconductor substrate at the intersection of four adjacent transistor cells.

3. The semiconductor device of claim 2, wherein each MOS-gated diode of the plurality of MOS-gated diodes comprises:
   an electrode trench formed in the semiconductor substrate and laterally spaced apart from the gate trench structures of the four adjacent transistor cells;
   a first region of the second conductivity type formed in the semiconductor substrate adjacent the electrode trench;
   a first region of the first conductivity type formed in the first region of the second conductivity type; and
   a conductive material electrically connecting the first region of the first conductivity type and the first region of the second conductivity type to an electrode in the electrode trench.

4. The semiconductor device of claim 3, wherein each MOS-gated diode of the plurality of MOS-gated diodes further comprises a second region of the first conductivity type formed in a recessed section of the first region of the second conductivity type, and wherein the conductive material contacts the first region of the first conductivity type and the second region of the first conductivity type.

5. The semiconductor device of claim 3, wherein each MOS-gated diode of the plurality of MOS-gated diodes further comprises a contact trench laterally surrounding the electrode trench and laterally spaced apart from the gate trench structures of the four adjacent transistor cells, and wherein the contact trench is filled with the conductive material.

6. The semiconductor device of claim 3, wherein each MOS-gated diode of the plurality of MOS-gated diodes further comprises a second region of the second conductivity type formed in the first region of the second conductivity type, wherein the second region of the second conductivity type is doped more heavily than the first region of the second conductivity type, and wherein the conductive material contacts the second region of the second conductivity type.

7. The semiconductor device of claim 1, wherein each Schottky diode of the plurality of Schottky diodes is formed in the semiconductor substrate at the intersection of four adjacent transistor cells.

8. The semiconductor device of claim 7, wherein each Schottky diode of the plurality of Schottky diodes comprises a metal or metal alloy in contact with a region of the semiconductor substrate of the first conductivity type.

9. The semiconductor device of claim 7, wherein each Schottky diode of the plurality of Schottky diodes comprises:
- an electrode trench formed in the semiconductor substrate and laterally spaced apart from the gate trench structures of the four adjacent transistor cells; and
- a metal electrically connecting an electrode in the electrode trench to a region of the semiconductor substrate of the second conductivity type adjacent the electrode trench.

10. The semiconductor device of claim 9, wherein a section of the region of the semiconductor substrate of the second conductivity type adjacent each electrode trench is recessed below a main surface of the semiconductor substrate, and wherein the metal of each Schottky diode of the plurality of Schottky diodes contacts a region of the semiconductor substrate of the first conductivity type formed above the recessed section of the region of the semiconductor substrate of the second conductivity type.

11. The semiconductor device of claim 9, wherein a section of the region of the semiconductor substrate of the second conductivity type adjacent each electrode trench is recessed below a main surface of the semiconductor substrate.

12. A method of manufacturing a semiconductor device, the method comprising:
- forming a plurality of transistor cells in a semiconductor substrate, each transistor cell comprising:
  - a gate trench structure formed in the semiconductor substrate and circumscribing the transistor cell;
  - a needle-shaped field electrode trench structure formed in the semiconductor substrate and spaced inward from the gate trench structure;
  - a source region of a first conductivity type formed in the semiconductor substrate adjacent the gate trench structure;
  - a body region of a second conductivity type opposite the first conductivity type formed in the semiconductor substrate below the source region; and
  - a drift zone of the first conductivity type formed in the semiconductor substrate below the body region; and
- forming a plurality of MOS-gated diodes or Schottky diodes outside the plurality of transistor cells, each diode of the plurality of MOS-gated diodes or Schottky diodes formed in the semiconductor substrate at an intersection of four adjacent transistor cells.

13. The method of claim 12, wherein forming the plurality of MOS-gated diodes or Schottky diodes in the semiconductor substrate comprises:
- etching electrode trenches of the plurality of MOS-gated diodes or Schottky diodes into the semiconductor substrate at a same time gate trenches of the plurality of transistor cells are etched into the semiconductor substrate, using a common trench etching process;
- forming a first dielectric on sidewalls and a bottom of the gate trenches and of the electrode trenches;
- after forming the first dielectric, forming an electrode in the electrode trenches to form electrode trench structures;
- forming a first region of the second conductivity type in the semiconductor substrate adjacent each electrode trench;
- forming a first region of the first conductivity type in each first region of the second conductivity type; and
- forming a conductive material which electrically connects the first region of the first conductivity type and the first region of the second conductivity type to the electrode in each electrode trench.

14. The method of claim 13, wherein forming the gate trench structures comprises:
- forming a second dielectric on the sidewalls and the bottom of the gate trenches, the second dielectric being thicker than the first dielectric; and
- after forming the second dielectric, forming an electrode in the gate trenches.

15. The method of claim 13, wherein the first region of the second conductivity type is formed in the semiconductor substrate adjacent each electrode trench at a same time the body region of the plurality of transistor cells is formed, using a common body implantation process.

16. The method of claim 13, wherein forming the plurality of MOS-gated diodes or Schottky diodes in the semiconductor substrate further comprises:
- forming a second region of the second conductivity type in each first region of the second conductivity type,
- wherein the second region of the second conductivity type is doped more heavily than the first region of the second conductivity type,
- wherein the conductive material contacts the second region of the second conductivity type.

17. The method of claim 13, wherein forming the plurality of MOS-gated diodes or Schottky diodes in the semiconductor substrate further comprises:
- recessing the electrode trench structures and a section of the first region of the second conductivity type to reduce the thickness of the first region of the second conductivity type along the sidewalls of the electrode trenches.

18. The method of claim 17, wherein the first region of the first conductivity type is formed in the recessed section of the first region of the second conductivity type.

19. The method of claim 13, wherein forming the plurality of MOS-gated diodes or Schottky diodes in the semiconductor substrate further comprises:
- etching a plurality of contact trenches into the semiconductor substrate, each contact trench laterally surrounding one of the electrode trenches and being laterally spaced apart from the gate trench structures of the four adjacent transistor cells; and
- filling the plurality of contact trenches with the conductive material.

20. The method of claim 12, wherein forming the plurality of MOS-gated diodes or Schottky diodes in the semiconductor substrate comprises:
- depositing an electrically conductive material in direct contact with the semiconductor substrate at the intersection of four adjacent transistor cells.

21. The method of claim 12, wherein forming the plurality of MOS-gated diodes or Schottky diodes in the semiconductor substrate comprises:
- etching a plurality of electrode trenches into the semiconductor substrate, each electrode trench being laterally spaced apart from the gate trench structures of the four adjacent transistor cells; and
- depositing a metal which electrically connects an electrode in each electrode trench to a region of the semiconductor substrate adjacent the electrode trench.

* * * * *